(12) United States Patent  
Agarwal

(10) Patent No.: US 10,269,421 B2  
(45) Date of Patent: Apr. 23, 2019

(54) LATCH CACHING OF SEQUENTIAL DATA

(71) Applicant: SanDisk Technologies LLC, Plano, TX (US)

(72) Inventor: Dinesh Agarwal, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 298 days.

(21) Appl. No.: 15/364,831

(22) Filed: Nov. 30, 2016

(65) Prior Publication Data

US 2018/0150400 A1 May 31, 2018

(51) Int. Cl.
*G06F 12/00* (2006.01)
*G11C 11/56* (2006.01)
*G06F 12/02* (2006.01)

(52) U.S. Cl.
CPC ...... *G11C 11/5628* (2013.01); *G06F 12/0215* (2013.01); *G06F 12/0246* (2013.01); *G06F 2212/1016* (2013.01); *G06F 2212/7203* (2013.01); *G11C 2207/2245* (2013.01); *G11C 2211/5621* (2013.01); *G11C 2211/5642* (2013.01); *G11C 2211/5643* (2013.01)

(58) Field of Classification Search
CPC ......... G11C 11/5628; G11C 2207/2245; G06F 12/0215; G06F 12/0246; G06F 2212/1016; G06F 2212/7203
See application file for complete search history.

(56) References Cited

U.S. PATENT DOCUMENTS

| | | |
|---|---|---|
| 8,316,176 B1 | 11/2012 | Phan et al. |
| 8,423,710 B1 | 4/2013 | Gole |
| 8,566,505 B2 | 10/2013 | Kilzer et al. |
| 8,677,058 B2 | 3/2014 | Jung et al. |
| 8,848,445 B2 | 9/2014 | Sprouse et al. |
| 8,874,833 B1 | 10/2014 | Gole |
| 9,063,671 B2 | 6/2015 | Avila et al. |
| 9,361,221 B1 | 6/2016 | Kankani et al. |
| 2011/0099323 A1 | 4/2011 | Syu |
| 2014/0223084 A1 | 8/2014 | Lee et al. |

*Primary Examiner* — Prasith Thammavong

(74) *Attorney, Agent, or Firm* — Vierra Magen Marcus LLP

(57) ABSTRACT

Technology is described herein for caching residual data in latches during a write operation of non-volatile storage. When writing data at the request of a host, it is possible for there to be some residual data that cannot be programmed at two (or more) bits per memory cell into a page of memory cells, given the programming scheme being used. This residual data may be cached in latches. The residual data from the latches may be combined with other data from the host to increase programming speed when programming, for example, sequential data using a full sequence programming scheme. Also, caching the residual data in latches keeps write amplification low.

20 Claims, 17 Drawing Sheets

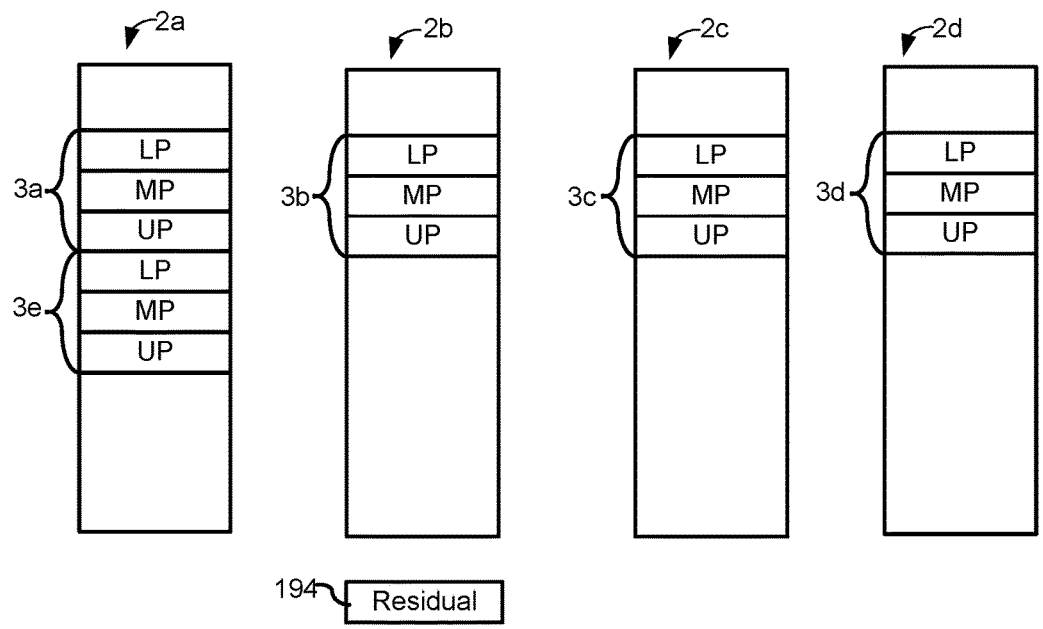
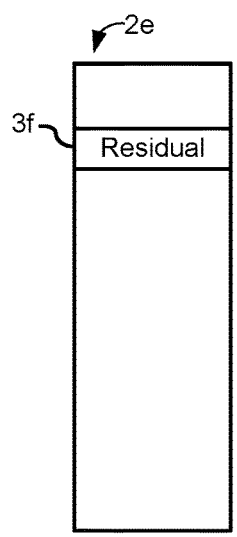
Fig. 1

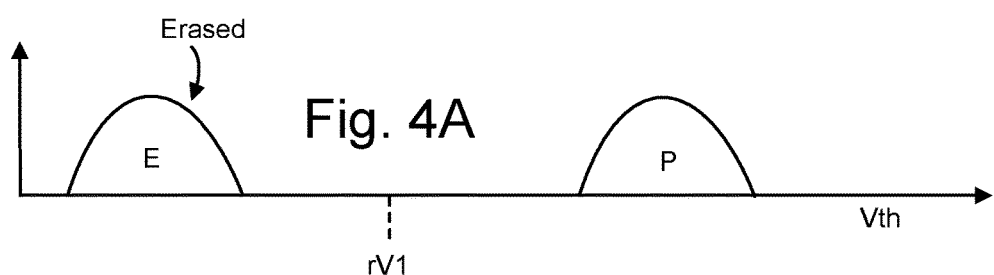
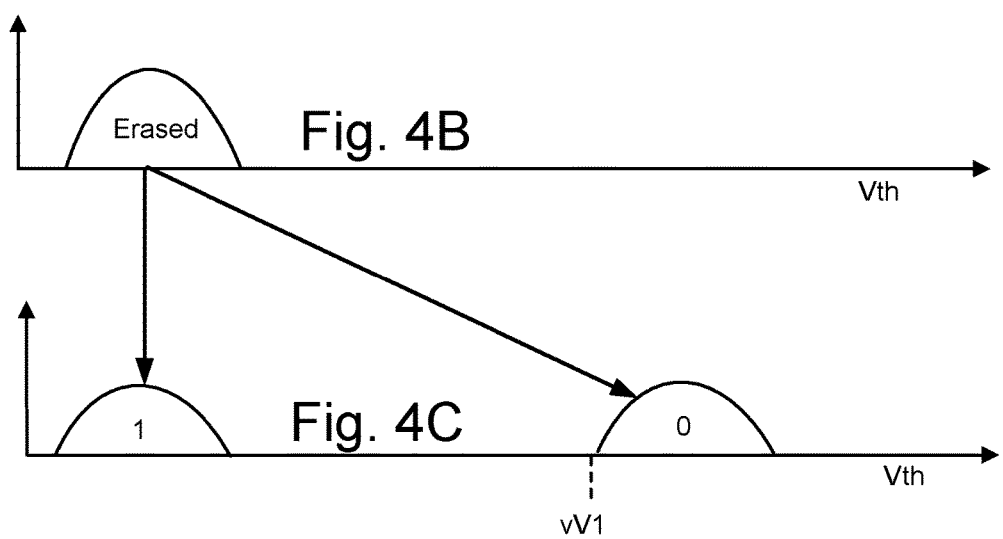

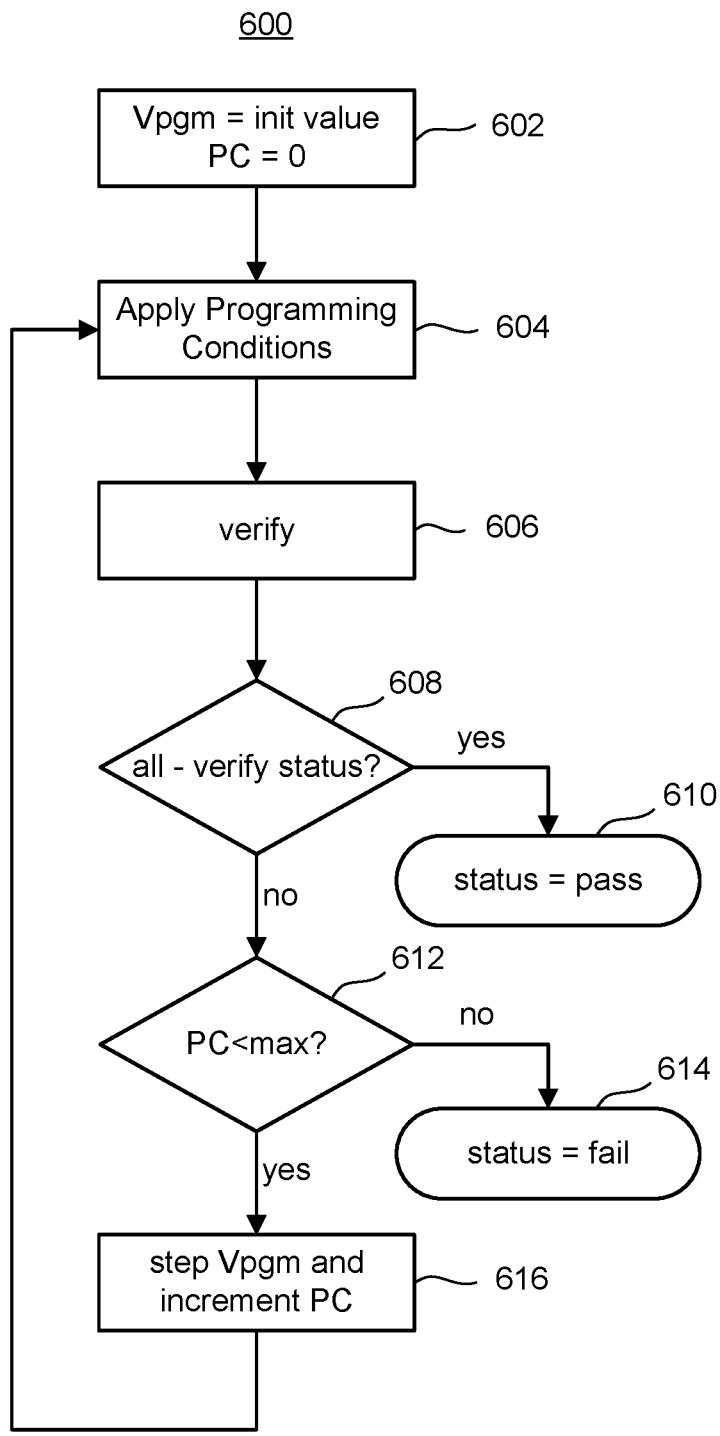

LATCH CACHING OF SEQUENTIAL DATA

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typically, the memory device has a memory controller and one or more memory packages. The memory package has one or more logical units. As one example, each logical unit can be a separate memory die. Each memory die contains non-volatile storage elements (e.g., non-volatile memory cells), as well as read and write circuitry. The memory package also contains addressing circuitry in order to properly address the memory cells. As one example, the memory package includes NAND flash memory. However, memory packages other than NAND flash are known.

The memory controller controls operation of the various memory packages. For example, the memory controller sends read, write (or program), erase, and other commands to the memory package. For some memory devices, the memory cells are organized as blocks. The commands identify which block of memory cells are to be accessed, in one possible scheme. Note that for some commands the address in the command further specifies which memory cells (e.g., page) within the block are to be accessed.

The memory device receives commands from a host to program units of data into memory cells in the memory device. The addressing scheme used by the host and the memory device are typically different. The address used by the host is typically referred to as a logical address. The memory device can incorporate a translation layer (e.g., a flash translation layer) that maps between the logical address (LA) used by the host and a physical address (PA) on the memory device at which the data is stored.

In order to improve read and program performance, multiple charge storage elements or memory transistors in an array are read or programmed in parallel. Thus, a "page" of memory elements are read or programmed together. In existing memory architectures, a row, or word line typically contains several interleaved pages or it may constitute one page. All memory elements of a page are read or programmed together.

The data may be stored in memory cells at one bit per memory cell, or as multiple bits per memory cell. One technique for storing a single bit per memory cell is to store one bit of a page of data into each memory cell in a group of memory cells. If two bits are to be stored per memory cell, then one bit of a first page and one bit of a second page may be stored into the group of memory cells. If three bits are to be stored per memory cell, then one bit of a first page, one bit of a second page, and one bit of a third page may be stored into the group of memory cells.

BRIEF DESCRIPTION OF THE DRAWINGS

FIG. 1 shows one embodiment in which the memory device caches a residual page in latches after using full sequence programing.

FIG. 4A-4C illustrate an example of a population of two-state memory cells (Single Level Cells, or "SLC" cells).

FIG. 6 is a flowchart describing one embodiment of a programming process, which includes one or more verification steps.

DETAILED DESCRIPTION

Figure 2A:
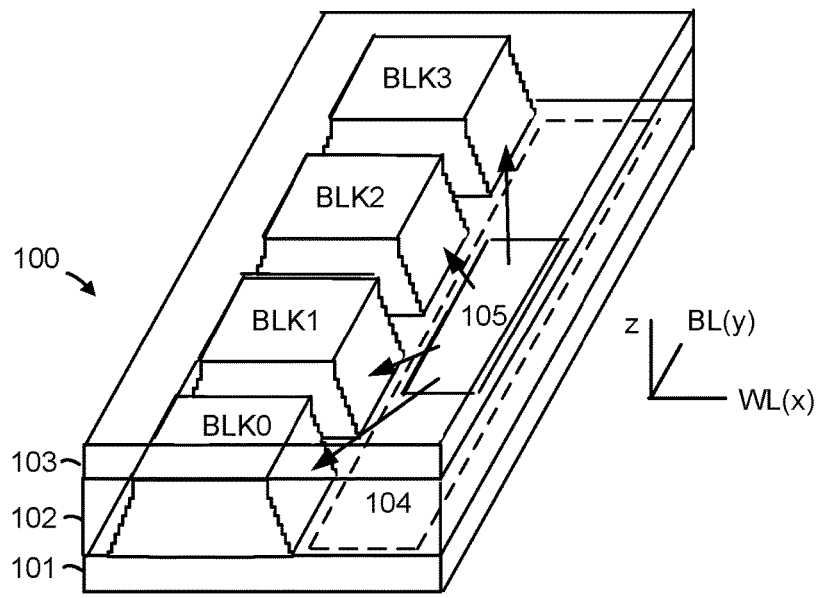
FIG. 2A is a perspective view of a set of blocks in a 3D stacked non-volatile memory device.

Technology is described herein for caching data in latches during a write operation of non-volatile storage. As noted above, the memory device may store data in units of pages. When storing multiple bits per memory cell, the memory device could store two (or more pages) into each group of memory cells. When writing some data at the request of a host, it is possible for there to be some residual data that cannot be programmed at two (or more) bits per memory cell into a page of memory cells, given the programming scheme being used. Stated another way, it is possible for there to be some residual data that cannot be programmed as two (or more) physical pages, given the programming scheme being used.

Embodiments disclosed herein cache the residual data in latches. The residual data from the latches may be combined with other data from the host to increase programming speed when programming, for example, sequential data. Also, embodiments disclosed herein keep write amplification low. One way of expressing write amplification is the ratio of the amount of data actually written to the memory to the amount of data the host requested to be written to the memory.

In some embodiments, a full sequence programming scheme is used. In one embodiment of full sequence programming, all of the memory cells in a group (e.g., page) are programmed to their respective states at the same time, in a single phase. For example, all "n" bits to be stored in a page of non-volatile memory cells are programmed in one programming phase. Thus, full sequence programming programs multiple pages together, in a single phase. For example, full sequence programming programs two pages (e.g., lower page, upper page) together into a page of memory cells when two bits are stored per memory cell; full sequence programming programs three pages (e.g., lower, middle, upper) together into a page of memory cells when three bits are stored per memory cell; and full sequence programming programs four pages together into a page of memory cells when four bits are stored per memory cell. Full sequence programming is in contrast to programming schemes that first program a first page into a group of memory cells in a first phase, then program a second page into the group in a second phase, etc. Thus, in some embodiments, after using full sequence programing to program a unit of data from a host, there may be one or more pages leftover. Embodiments disclosed herein cache the leftover one or more pages. This provides for a more efficient solution than, for example, first caching the data as a single bit per memory cell and later folding into multiple bits per memory cell.

FIG. 1 shows one embodiment in which the memory system caches a residual page in latches after using full sequence programing. In this case, the memory system programs a 512 KB unit of data from the host into physical pages of 32 KB. In this example, four separate blocks 2a-2d of non-volatile memory cells are depicted. Blocks 2a-2d are used for storing multiple bits per memory cell, and are referred to as MLC (multi-level cell) blocks. Blocks 2a-2d could each be on a different memory die within the memory system. However, the blocks 2a-2d could also be on the same memory die. Block 2e is used to store a single bit per non-volatile memory cell, and may be referred to as an SLC (single-level cell) block.

The memory system programs the data into a group of memory cells as a lower page (LP), middle page (MP), and upper page (UP) per group, in this example. Five groups 3a-3e of memory cells are represented for the MLC blocks. Each group of memory cells represents a page of memory cells. Each of those five groups 3a-3e is programmed with three pages of data, in this example. In this example, programming three bits per memory cell is the minimum write unit. In other words, programming the lower, middle, and upper pages into a group (e.g., page) of memory cells requires that all three pages be available at the same time, for a programming technique used in this example. One example of such a programming technique is referred to herein as "full sequence programming."

Assuming a page is 32 KB, for the sake of example, this results in 480 KB being programmed into the five groups 3a-3e in the MLC blocks 2a-2d. However, the unit of data from the host is 512 KB, in this example. This leaves 32 B that cannot be programmed into an MLC block as multiple bits per memory cell, given the physical page size and the full sequence programming technique. This 32 KB is referred to as a "tail", or as "residual data." The memory device stores the tail into a group of latches 194, in one embodiment. Optionally, the residual data may also be stored in a group 3f of non-volatile memory cells in the SLC block 2e, to be used as safeguard in the event that the data in latches 194 is lost. For example, the latches 194 could be volatile, in which case the residual data could be lost if the memory system loses power.

Technology described herein may be used with a variety of type of memory. One example is a 3D stacked non-volatile memory device. FIG. 2A is a perspective view of a set of blocks in a 3D stacked non-volatile memory device. The memory system 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent control gate layers. In one possible approach, the control gate layers of each block at a common height are connected to one another and to a voltage driver. While four blocks are depicted as an example, two or more blocks can be used, extending in the x- and/or y-directions.

The length of the plane, in the x-direction, may represent a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 2B:
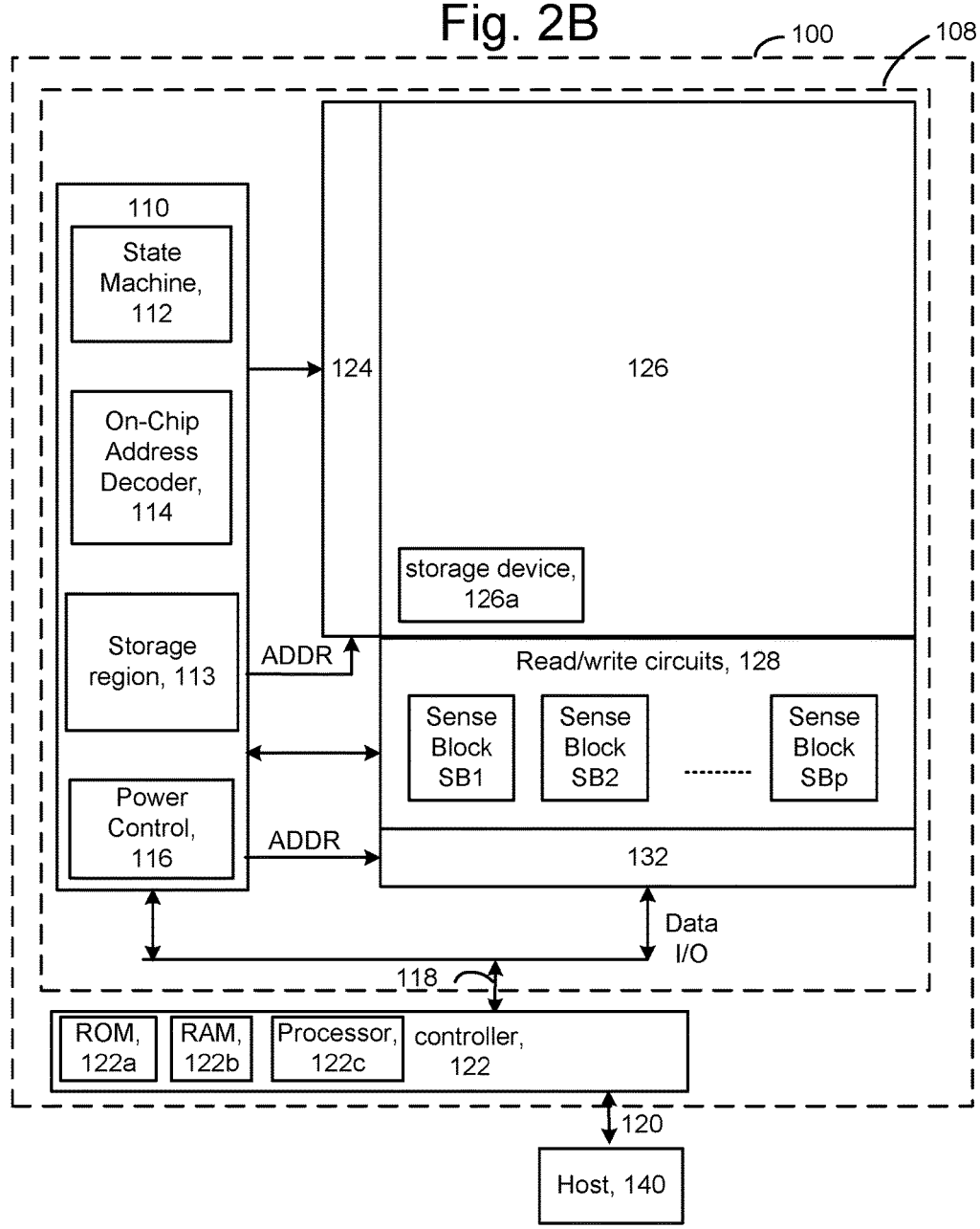
FIG. 2B is a functional block diagram of a memory device such as the 3D stacked non-volatile memory device of FIG. 2A.

FIG. 2B is a functional block diagram of a memory device such as the 3D stacked non-volatile memory system 100 of FIG. 2A. The memory system 100 may include one or more memory die 108. The set of blocks of FIG. 2A can be on one die. The memory die 108 includes a memory structure 126 of memory cells, such as an array of memory cells, control circuitry 110, and read/write circuits 128. In a 3D configuration, the memory structure can include the blocks of FIG. 2A. The memory structure 126 is addressable by word lines via a row decoder 124 and by bit lines via a column decoder 132. The read/write circuits 128 include multiple sense blocks SB1, SB2, . . . ,SBp (sensing circuitry) and allow a page of memory cells to be read or programmed in parallel. Typically a controller 122 is included in the same memory system 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD select gates and source lines. The sense blocks can include bit line drivers, in one approach. An SGS select is a gate transistor at a source-end of a NAND string, and an SGD select gate is a transistor at a drain-end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . ,SBp, read/write circuits 128, controller 122, and so forth.

The off-chip controller 122 may comprise a processor 122*c* and storage devices (memory) such as ROM 122*a* and RAM 122*b*. The storage devices comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

The code is used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Other types of non-volatile memory in addition to NAND flash memory can also be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels.

One of skill in the art will recognize that this technology is not limited to the two dimensional and three dimensional exemplary structures described but covers all relevant memory structures within the spirit and scope of the technology as described herein and as understood by one of skill in the art.

Figure 2C:
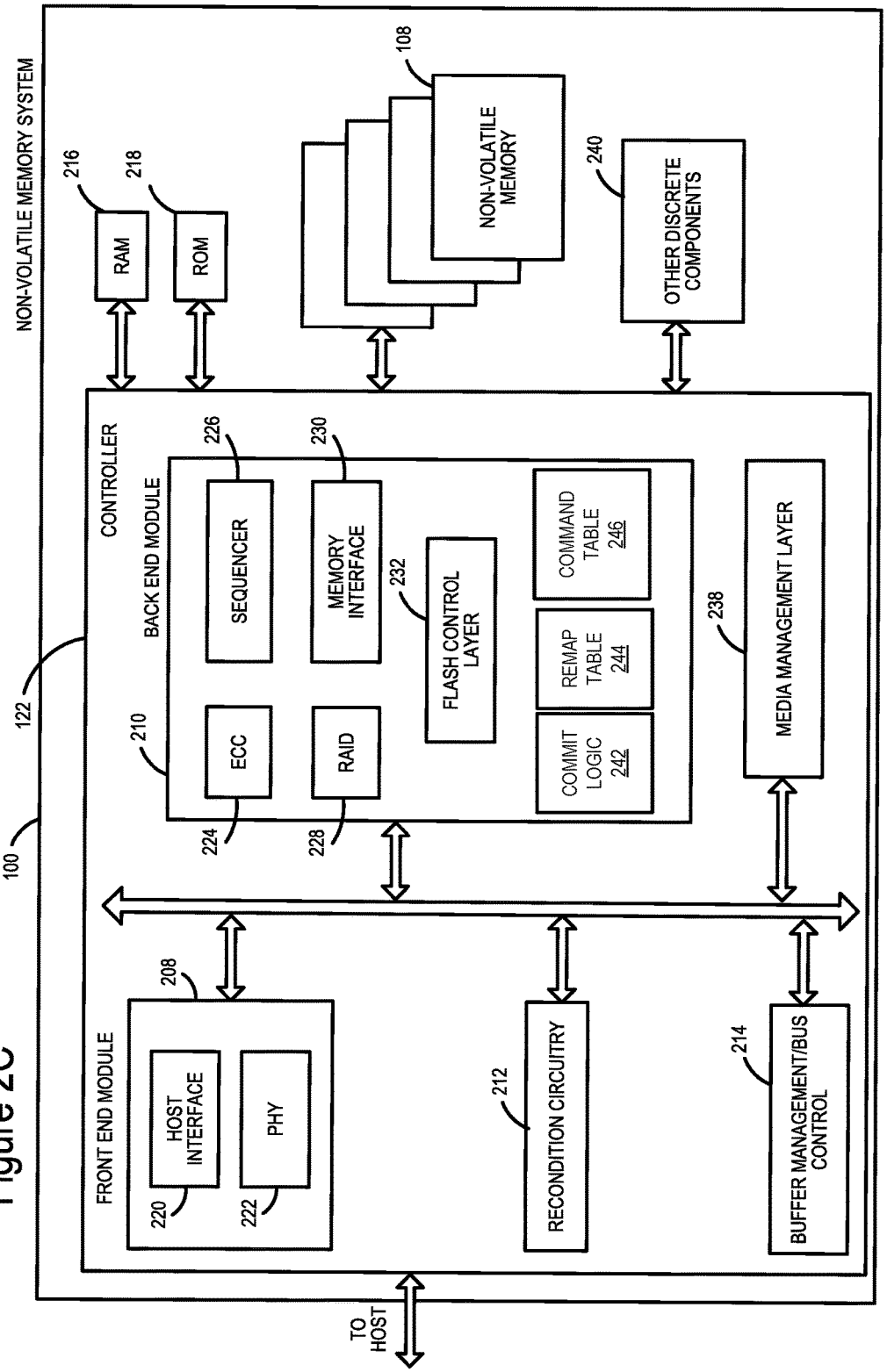
FIG. 2C is a block diagram of example memory system, depicting more details of Controller.

FIG. 2C is a block diagram of example memory system 100, depicting more details of Controller 122. In one embodiment, the system of FIG. 2C is a solid state drive. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address (LA) to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface. In one embodiment, memory system 100 may be a card based system, such as a secure digital (SD) or a micro secure digital (micro-SD) card. In an alternative embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 2C, Controller 122 includes a front end module 208 that interfaces with a host, a back end module 210 that interfaces with the one or more non-volatile memory die 108, and various other modules that perform functions which will now be described in detail.

The components of Controller 122 depicted in FIG. 2C may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for Controller 122 to perform the functions described herein. The architecture depicted in FIG. 2C is one example implementation that may (or may not) use the components of Controller 122 depicted in FIG. 2B (i.e. RAM, ROM, processor).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 2C as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface. A flash control layer 232 controls the overall operation of back end module 210.

Additional components of system 100 illustrated in FIG. 2C include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory.

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

The memory controller 122 of one embodiment has a remap table 244. In one embodiment, the remap table 244 contains a mapping of logical addresses to physical addressees. This mapping may be at a block level, page level, or combination of block and page level. The mapping is not limited to blocks and pages. The physical address may be of a group of memory cells. For example, the physical address could point to a block of memory cells, a page of memory cells, or some other unit of memory cells. In one embodiment, the physical address may point to a group of data latches (e.g., FIG. 3, 194). In one embodiment, the remap table 244 is stored in RAM 216. However, remap table 244 could also be stored in storage device region 126a of the memory structure 126 on one or more of the memory die 108.

In one embodiment, the memory controller 122 has commit logic 242, which performs a commit operation during a programming operation, which may in effect create a pointer to a valid physical location of a logical address.

The memory controller 122 maintains a command table 246 of recent commands in one embodiment. Each time the memory controller 122 receives a new write command from the host, the command table 246 may be updated with the logical address of the data in the command. The length of the data may also be included in command table 246. Thus, the command table 246 may include the logical address of the units of data recently received from the host.

Figure 3:
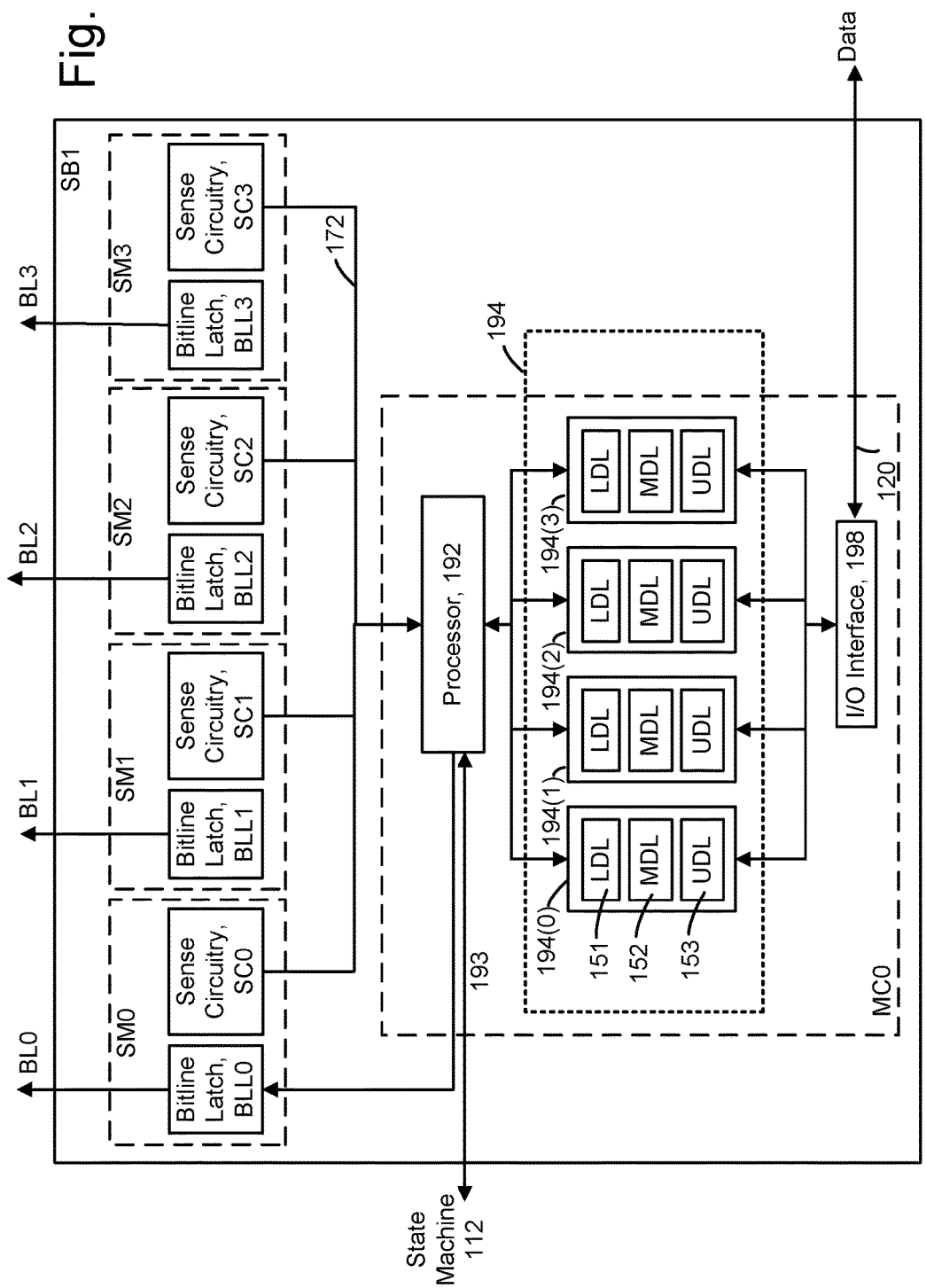
FIG. 3 is a block diagram depicting one embodiment of the sense block SB1 of FIG. 2B.

FIG. 3 is a block diagram depicting one embodiment of the sense block SB1 of FIG. 2B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194(0), 194(1), 194(2) and 194(3) and an I/O interface 198 coupled between the sets of data latches 194 and the data bus 120. In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3. Each set of data latches includes data latches identified by LDL 151, MDL 152, and UDL 153, in this embodiment. LDL 151 stores a bit for a lower page (LP) of write data, MDL 152 stores a bit for a middle page (MP) of write data, and UDL 153 stores a bit for an upper page (UP) of write data, in a memory which stores three bits of data in each memory cell. Note that there may be one set of such latches associated with each bit line. Thus, there may be a page of latches 194 associated with a page of memory cells. The latches 194 may also be used to store data read from the non-volatile memory cells.

Additional or fewer data latches per set could be used as well. For example, in a two-bit per memory cell implementation, the MDL data latch for the middle page (MP) of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrA, VrB, Vrc, VrD, VrE, VrF, and VrG in FIG. 5A) corresponding to the various memory states supported by the memory (e.g., states A, B, C, D, E, F, and G), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the data latches 194. For example, the memory state for a memory cell associated with bit line BL0 may be stored in latches 194(0), etc. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the data latches 194 from the data bus 120, in the LP, MP, and UP data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of the state machine, comprises a series of programming voltage pulses applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194 may be implemented as a stack of data latches for each sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 4A-4C illustrate an example of a population of two-state memory cells (Single Level Cells, or "SLC" cells). FIG. 4A illustrates how the population of memory cells are programmable into two distinct distributions of threshold voltages, an erased state, "E" and a programmed state, "P." Memory cells may be read by determining whether their threshold voltages are above or below a read voltage, rV1. FIG. 4B illustrates the initial distribution of "erased" threshold voltages for an erased memory. FIG. 4C illustrates an example of the memory after the memory cells have been programmed. Essentially, a cell initially has an "erased" threshold voltage and programming will move it to a higher value into a zone demarcated by verify level vV1. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

Figure 5A:
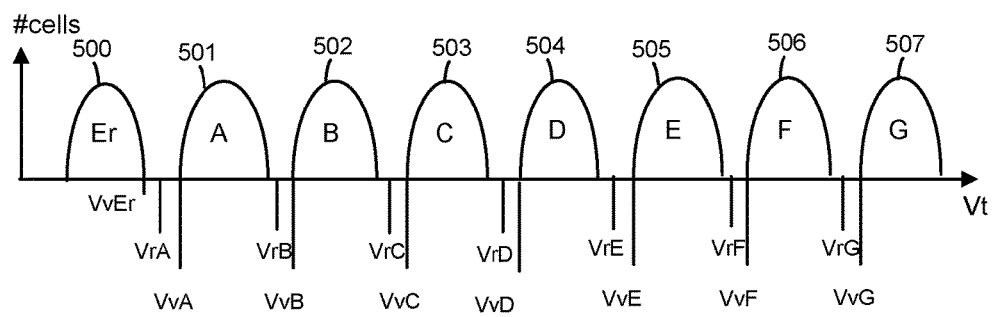
FIG. 5A-5C illustrate an example of a population of eight-state memory cells (Multi Level Cells, or "MLC" cells).

More than one bit may be stored in a memory cell. For example, when two bits are stored per memory cell there may be four distinct distributions of threshold voltages. When three bits are stored per memory cell there may be eight distinct distributions of threshold voltages. FIG. 5A illustrates example $V_T$ distributions 500-507 corresponding to data states for the memory cell array when each memory cell stores three bits of data. Other embodiments, however, may use more or fewer than three bits of data per memory cell. The y-axis represents the number of memory cells. This may be a logarithmic scale. The x-axis represents threshold voltage ($V_T$) of the memory cells.

FIG. 5A shows eight $V_T$ distributions 500-507 corresponding to an Erase state (Er) and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

At or near the lower edge of the threshold distribution for each programmed state is a verify reference voltage. For example, FIG. 5A shows VvA for the A-state, VvB for the B-state, VvC for the C-state, VvD for the D-state, VvE for the E-state, VvF for the F-state, and VvG for the G-state. When programming memory cells to a given state, the control circuit will test whether those memory cells have a threshold voltage greater than or equal to the verify reference voltage.

Figure 5B:
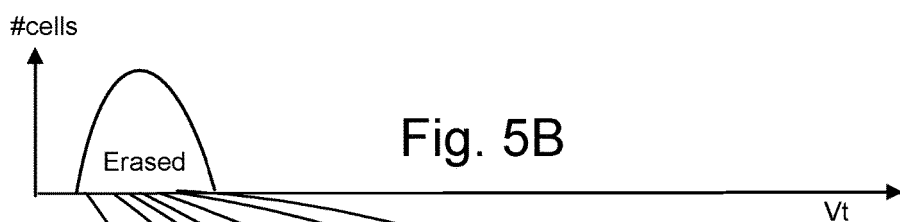

Between each adjacent pair of the $V_T$ distributions are read reference voltages used for reading data from memory cells. For example, FIG. 5B shows read reference voltage VrA between the erase state and the A-state, VrB between the A-state and B-state, VrC between the B-state and C-state, VrD between the C-state and D-state, VrE between the D-state and E-state, VrF between the E-state and F-state, and VrG between the F-state and G-state. By testing whether the threshold voltage of a given memory cell is above or below the respective read reference voltages, the control circuit can determine what state the memory cell is in. For example, a memory cell whose threshold voltage is greater than VrD, but less them VrE may be assumed to be in the D-state.

Figure 5C:
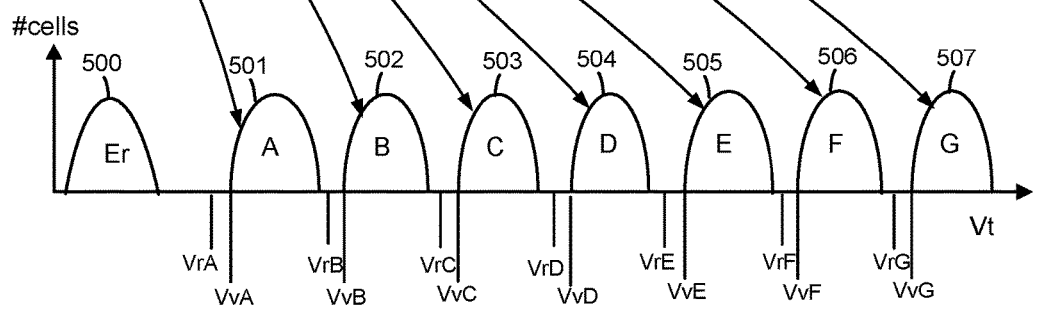

In full sequence programming, storage elements can be programmed from the Erased-state directly to any of the programmed states A, B, C, D, E, F, or G in a single programming phase. For example, a population of storage elements to be programmed may first be erased so that all storage elements in the population are in the Erased-state, as depicted in FIG. 5B. A series of program pulses is used to program storage elements directly into the A-, B- C-, D-, E-, F-, or G-states in a single programming phase, as represented by FIG. 5C. While some storage elements are being programmed from the Erased-state to the A-state, other storage elements are being programmed from the Erased-state to the B-state, from the Erased-state to the C-state, from the Erased-state to the D-state, from the Erased-state to the E-state, from the Erased-state to the F-state, and/or from the Erased-state to the G-state.

For a memory cell being programmed to the A-State, when the threshold voltage reaches VvA, the storage element is locked out from further programming, in one embodiment. Similarly, when the threshold voltage of a B-state storage element exceeds VvB, the storage element is locked out from further programming, in one embodiment. Memory cells to be programmed to the C-, D-, E-, F-, and G-state may also be locked out upon reaching their respective target threshold voltages, in one embodiment.

Full sequence programming is in contrast to multi-phase programming in which multiple phases are used to program multiple pages into a group of memory cells. For example, in multi-phase programming for two bits per memory cell, a first phase might be used to program the B and C-states to an intermediate state in a first programming phase. This may be used to program a lower page. Then, in a second programming phase, the A-state cells may be programmed from the erase state. Also, in the second programming phase, the B and C-states might be programmed to their respective states. This may be used to program an upper page. Note that the lower page could be read back after the first programming phase is complete. In one embodiment of multi-phase programming, each page is programmed in one programming phase.

Figure 5D:
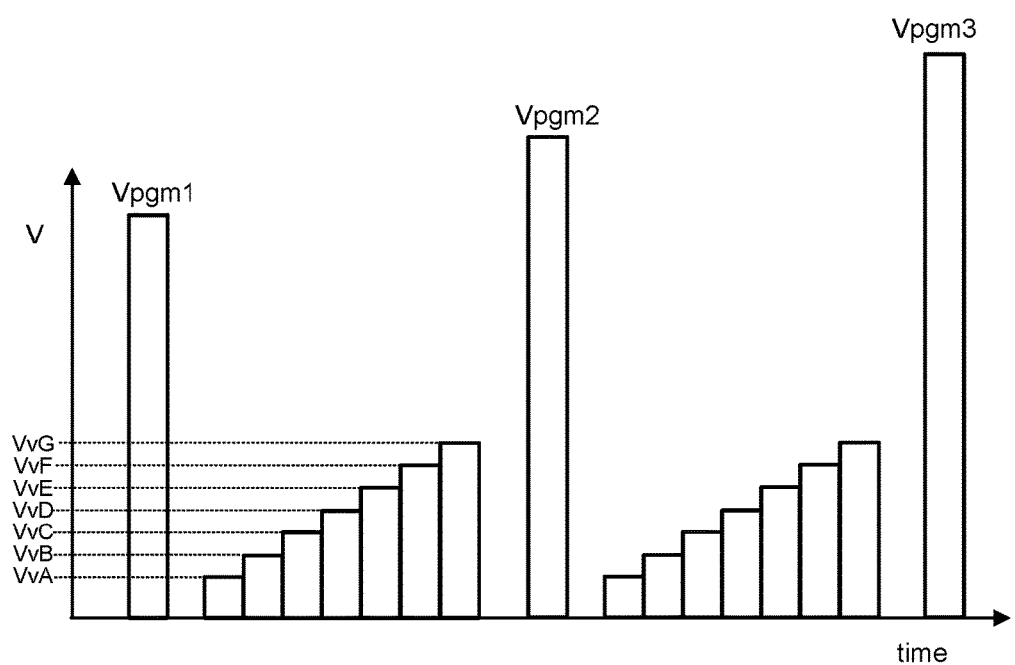
FIG. 5D depicts a series of program and verify pulses which are applied to a selected word line during one embodiment of full sequence programming operation, which programs three bits per memory cell.

FIG. 5D depicts a series of program and verify pulses which are applied to a selected word line during one embodiment of a full sequence programming operation, which programs three bits per memory cell. A programming operation may include multiple programming iterations, where each iteration applies one or more program pulses (voltages) to a selected word line followed by one or more verify voltages, to the selected word line. In one possible approach, the program voltages are stepped up in successive iterations. For example, in one embodiment, Vpgm1<Vpgm2<Vpgm3. It is not required that the program voltage be stepped up in magnitude each iteration. In one embodiment, the duration (or width) of the program pulse is adjusted from one iteration to the next. For example, the duration could be increased from at least one of the iterations to the next. A set of one or more verify voltages may be provided after each program pulse. In the example of FIG. 5D, there are seven verify voltages (VrA, VrB, VrC, VrD, VrE, VrF, VrG) following each program pulse. However, it is not required that all verify voltages be applied following each program pulse. For example, for some of the earlier program voltages in the sequence, some of the higher Vt states might not be verified.

FIG. 6 is a flowchart describing one embodiment of a programming process 600, which includes one or more verification steps. In some embodiments, process 600 is used in a full programming sequence. At the end of a successful programming process (with verification), the threshold voltages of the memory cells should be within one or more distributions of threshold voltages for programmed memory cells or within a distribution of threshold voltages for erased memory cells, as appropriate. FIG. 4A depicts results after one embodiment of process 600 is complete for SLC programming. FIG. 5A depicts results after one embodiment of process 600 is complete for MLC programming.

Process 600 is used to program some unit of memory cells. The number of memory cells in the unit may be equal to the number of bits in a physical page. In one embodiment, process 600 is used to program "n" physical pages at "n" bits per memory cell. For example, one physical page may be programmed into the unit of memory cells at one bit per cell; two physical pages may be programmed into the unit of memory cells at two bits per cell; three physical pages may be programmed into the unit of memory cells at threes bits per cell, etc. For purpose of discussion, the unit of memory cells may be referred to as a "page" of memory cells or as a "physical page" of memory cells.

In step 602, the program voltage (Vpgm) is set to an initial value. Also, in step 602, a program counter (PC) is initialized to zero.

In step 604, programming conditions are applied. Step 604 includes applying a program pulse to control gates of the memory cells. For example, Vpgm is applied to a selected word line that is connected to the page of memory cells. Step 604 may also include establishing programming conditions on bit lines. Bit lines associated with memory cells to receive programming may be provided with a program enable voltage; bit lines associated with memory cells to be prevented from programming may be provided with a program inhibit voltage. In one embodiment, the program enable voltage is about 0V. In one embodiment, the program inhibit voltage is about 2 to 3 V. In one full sequence programming embodiment in which three bits are stored per memory cell, all memory cells to be programmed to any of the A-, B-, C-, D-, E-, F- and G-states are initially enabled for programming.

In step 606, a verification process is performed. Step 606 may include applying a voltage to control gates of the page of memory cells, and determining whether the threshold voltage of the memory cell has reached a target threshold voltage. Referring to FIG. 4C, step 606 applies vV1 to the selected word line in one embodiment of SLC programming. Referring to FIG. 5A, step 606 includes applying one or more of VrA, VrB, VrC, VrD, VrE, VrE, or VrG to the selected word line in one embodiment of MLC programming. Memory cells that pass verify are locked out from further programming, in one embodiment. Locking out from programming may be accomplished by setting data latches (e.g., a set of latches 194 and/or a Bitline Latch BLL0-BLL3) to a value that indicates that the memory cell is to be inhibited from further programming. When step 604 is next performed, the program inhibit conditions are applied to the bit line, instead of the program enable conditions.

In step 608, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 608 is referring to all states having completed programming.

If verification passes, the programming process is completed successfully (status=pass) in step 610. If all of the memory cells are not all verified, then it is determined whether the program counter (PC) is less than a maximum value such as 20. If the program counter (PC) is not less than max (step 612), then the program process has failed (step 614). If the program counter (PC) is less than a maximum value (e.g., 20), then the program counter (PC) is incremented by 1 and the program voltage (Vpgm) is stepped up to the next pulse in step 616. Subsequent to step 616, the process loops back to step 604 and the next program pulse is applied to the memory cells.

Figure 7:
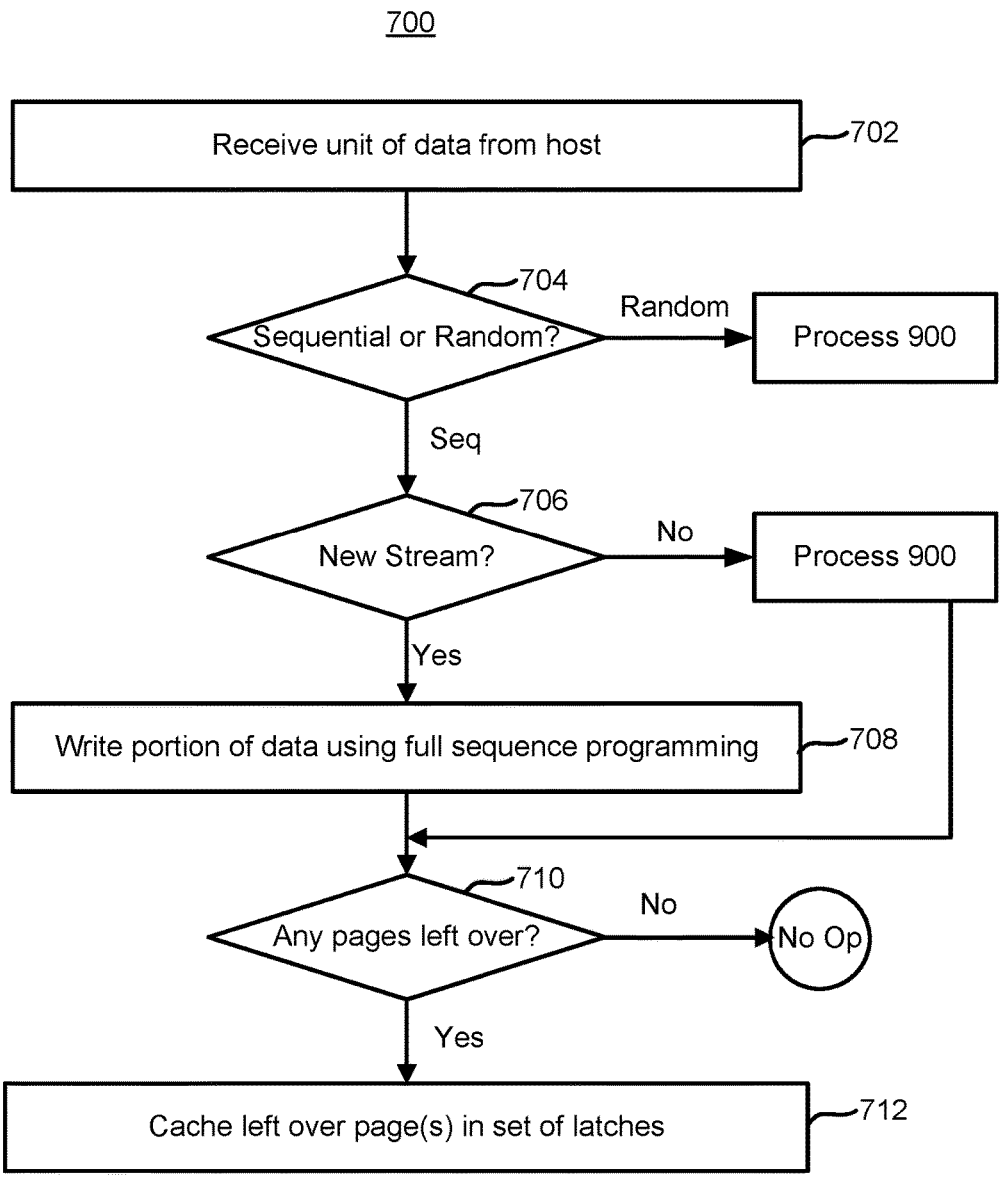
FIG. 7 is a flowchart of one embodiment of a process of writing data to non-volatile memory storage, and caching a residual page of data in latches.

FIG. 7 is a flowchart of one embodiment of a process 700 of writing data to non-volatile memory storage, and caching a residual page of data in latches. Process 700 may be performed by the control circuit of the memory system 100. Step 702 includes receiving a unit of data from a host to store into the non-volatile memory cells of the memory system 100. The unit of data has a logical address, in some embodiments. The size of the unit of data may vary. For example, the unit of data may be 512 KB, 32 KB, 4 KB, etc. In some cases, the size of the unit of data may be equal to an integer number of physical pages. For example, a 512 KB unit of data is equal to 16 physical pages at 32 KB per page. Physical pages are not required to be 32 KB. However, the unit of data is not required to be equal to an integer number of physical pages. For example, some random data might be smaller than a physical page.

Figure 11:
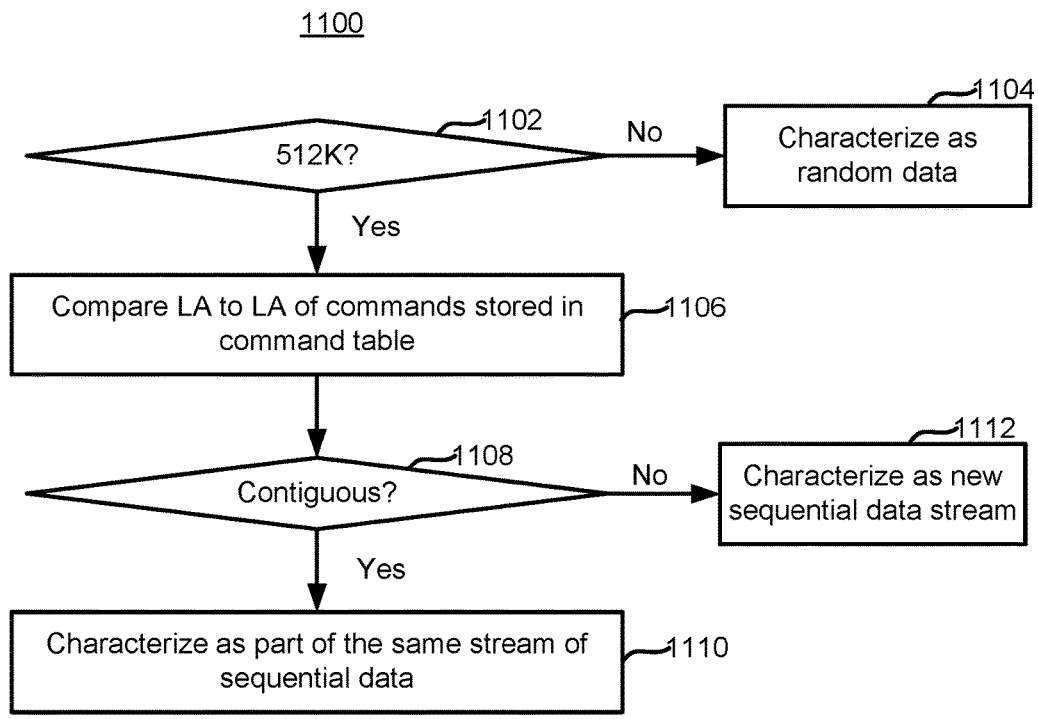
FIG. 11 is one embodiment of a process of determining whether data is sequential or random, and if sequential, determining whether it is part of a sequential data stream.

Step 704 is a determination of whether the unit of data is sequential or random data. In one embodiment, the determination is based on the size of the unit of data. For example, sequential data is expected to be larger than random data, in one embodiment. As one example, sequential data is expected to be 512 KB, and random data is expected to be considerable smaller, in one embodiment. Step 704 may also be described as the control circuit characterizing the data is either sequential or random. This is because the control circuit has some freedom to characterize the data as is convenient. FIG. 11 provides further details of one embodiment of step 704.

If the control circuit characterizes the data as random, then process 1300 of FIG. 13 is performed, in one embodiment. Otherwise, the control circuit characterizes the data as sequential, and step 706 is performed.

Step 706 is a determination of whether this is a new stream of sequential data. A stream of sequential data may be defined based on the logical addresses of units of data from the host. For example, a stream may be defined as sequential data that has a contiguous group of logical addresses. In general, the memory system could be processing numerous different streams of sequential data at the same time. If so, one sequential stream of data may be stored in one set of one or more memory die and another sequential stream of data in another set of one or more memory die.

Figure 9C:
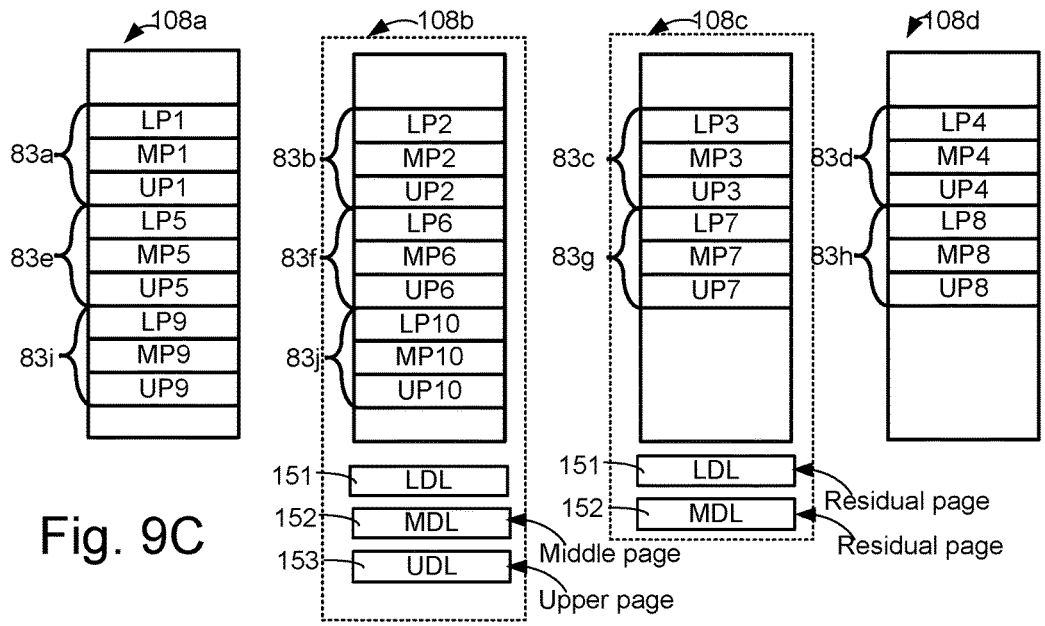
FIG. 9C is a diagram that represents programming a second unit of data from the host that is in the same sequential data stream as the unit of data from FIG. 8A.
Figure 9A:
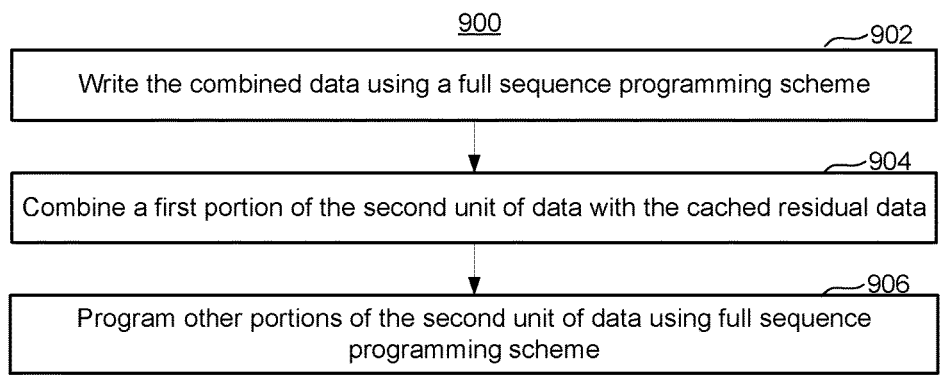
FIG. 9A is a flowchart of one embodiment of a process of combining the residual data that was cached in the volatile latches with other data from the host.

If the control circuit determines that the sequential data is part of an existing stream, then process 900 of FIG. 9A is performed, in one embodiment. Otherwise, if the control circuit determines that this is a new stream of sequential data, then step 708 is performed.

Figure 8B:
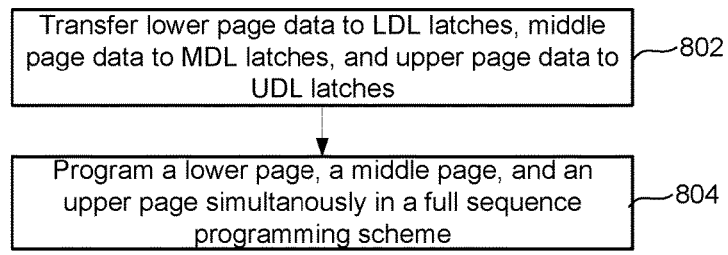
FIG. 8B is a flowchart of one embodiment of a process that may be used to perform step 708 of FIG. 7.
Figure 8A:
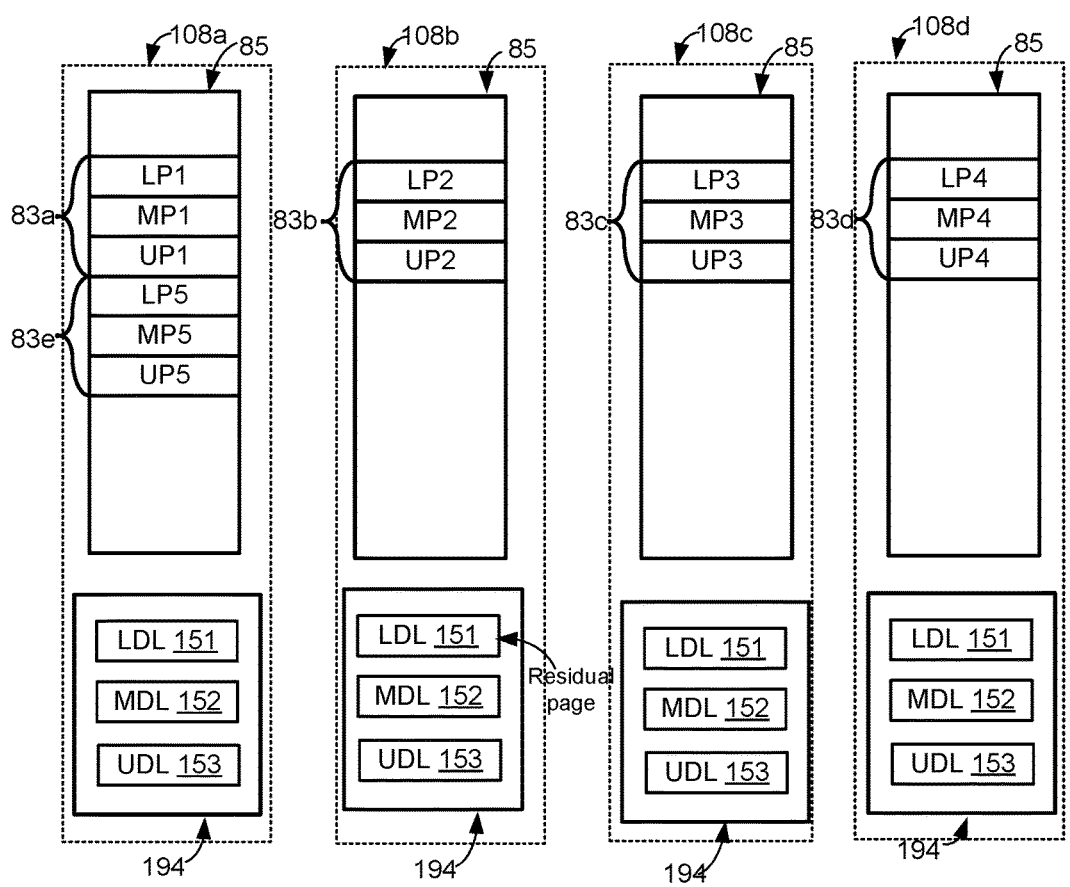
FIG. 8A is a block diagram to illustrate how lower, middle, and upper pages may be programmed during one embodiment of step 708 of FIG. 7.

Step 708 includes writing at least a portion of the unit of data using full sequence programming. FIG. 8A is a block diagram to illustrate how lower, middle, and upper pages may be programmed during one embodiment of step 708. FIG. 8A shows four different memory die 108a, 108b, 108c, and 108d. Each memory die contains non-volatile memory cells 85 and latches 194. The latches are volatile, in some embodiments. In the depicted embodiment, latches 194 for each die include a page of LDL latches 151, a page of MDL latches 152, and a page of UDL latches 152. Each page of latches may temporarily store data to be programmed into one page of memory cells on that die. There could be more or fewer pages of latches per die. For example, for programming two bits per memory cell, the MDL latches 152 are not needed. For programming four bits per memory cell another page of latches can be added. FIG. 8B is a flowchart of one embodiment of a process 800 that may be used to perform step 708.

In step 802, one page of lower page data is transferred to a group (e.g., page) of LDL latches 151 on a memory die, one page of middle page data is transferred to a group (e.g., page) of MDL latches 152 on that memory die, and one page of upper page data is transferred to a group (e.g., page) of UDL latches 153 on that memory die. As one example, each physical page is 32 KB. However, the physical page could be larger or smaller.

In step 804, the lower page, the middle page, and the upper page are programmed together into non-volatile memory cells on the memory die. Referring to FIG. 8A, LP1, MP1, and UP1 are programmed into memory cells in group 83a. The data for this comes from the latches 194 on memory die 108a. Group 83a is one physical page of memory cells, in one embodiment. Likewise, each of the other groups 83b, 83c, 83d, 83e are one physical page of memory cells, in one embodiment.

Process 800 may be repeated for other pages. In the example of FIG. 8A, five different groups 83a-83e of memory cells are programmed. Group 83b receives pages LP2, MP2, and UP2 (from the latches 194 on memory die 108b). Group 83c receives pages LP3, MP3, and UP3 (from the latches 194 on memory die 108c). Group 83d receives pages LP4, MP4, and UP4 (from the latches 194 on memory die 108d). Group 83e receives pages LP5, MP5, and UP5. The latches 194 on memory die 108a may be overwritten with LP5, MP5, and UP5 to enable this write. In this example, each group receives three pages. At least some of the various groups 83a-83e could be programmed in parallel. For example, groups 83a-83d could be programmed in parallel, as they are on different memory die, and use different latches 194. Parallel programming of groups 83a-83d is not required.

Step 710 is a determination of whether there are any pages left over after the full sequence programming. If not, then the process 700 ends. For the sake of illustration, assume that this leaves one page from the unit of data from the example of FIG. 8A still unprogrammed. This left over data is referred to herein as "residual data." Note that there is not sufficient first data remaining to program as three physical pages into a physical page of memory cells. In other words, there is not enough data to program the group (e.g., page) of memory cells at three bits per memory cell, given the number of memory cells in the group.

Step 712 is caching leftover pages in a group (e.g., page) of volatile latches. The one page of left over data from the example of FIG. 8A may be stored into LDL latches 151 on memory die 108b. Thus, many different LDL latches may each receive one bit of the residual page. For example, one page of residual data may be stored in one page of LDL latches 151. If there were two pages of left over data, one page may be stored in the LDL latches 151 on memory die 108b, and the other page in the MDL latches 152 on memory die 108b.

Next, one embodiment of a process of combining the residual data that was cached in the volatile latches 194 with other data from the host will be described. Referring still to FIG. 7, in step 702 the memory system might receive another unit of data from the host, in step 702. For the sake of illustration, the memory system characterizes the data as sequential data, in step 704. In step 706, the memory system determines whether this new data is part of a new sequential data stream. For the sake of illustration, the memory system determines that this is part of the same data stream as the example from FIG. 8A. In this case, the process 900 of FIG. 9 may be performed.

FIG. 9A is a flowchart of one embodiment of a process 900 of combining the residual data that was cached in the volatile latches with other data from the host. In step 902, a first portion of the second unit of data is combined with the cached residual data. In one embodiment, step 902 includes transferring the first portion of the second unit of data to data latches on the same memory die that contains the cached residual data. For example, if the cached residual data is in the LDL latches 151 on memory die 108b, then the first portion of the second unit of data may be transferred to the MDL latches 152 and the UDL latches 153 on the same memory die 108b.

In step 904, the combined data is written to a group (e.g., page) of memory cells using a full sequence programming scheme. Further details of embodiments of steps 902-904 are discussed in connection with steps 9B, 9C, 10A, and 10B.

In step 906, other portions of the second unit of data are programmed into other pages of memory cells using the full sequence programming scheme. This might or might not result in a residual page. After step 906, step 710 of process 700 is performed to determine whether there is/are any residual pages. If so, the residual page(s) are cached in step 712.

Figure 9B:
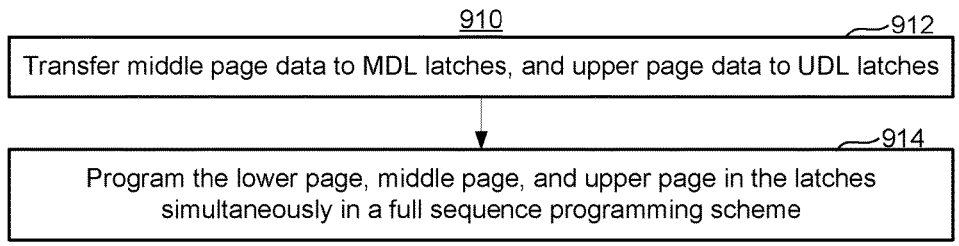
FIG. 9B provides of a flowchart of a process that shows further details of one embodiment of steps 902-904 of process 900 of FIG. 9A in which the residual data is a single page of data.

FIG. 9B provides of a flowchart of a process 910 that shows further details of one embodiment of steps 902-904 of process 900 in which the residual data is a single page of data. In step 912, a middle page of data is transferred to a group (e.g., page) of MDL latches 152 on the die that contains the data latches in which the residual data is stored. Also, an upper page of data is transferred to a group (e.g., page) of UDL latches 153 on that memory die. With reference to FIG. 9C, the middle page is transferred to a page of MDL latches 152 on memory die 108b, the upper page is transferred to a page of UDL latches 153 on memory die 108b. Thus, after step 912 the LDL 151, MDL 152, and UDL 153 latches contain the data to program three pages of data into a group of memory cells, using a full sequence programming scheme. Note that no transfer of data is required for the lower page, as it was already stored in the page of LDL latches 151 on memory die 108b. Step 912 is one embodiment of combining new data with cached residual data of step 902.

Also note that in some embodiments the memory controller checks to determine whether there is valid residual data in the volatile latches, in step 912. For example, the memory controller may store a remap table 244 that indicates which volatile latches hold valid residual data.

In step 914, the lower page, the middle page, and the upper page are programmed together into a group (e.g., page) of memory cells using a full sequence programming scheme. FIG. 9C will be referred to in order to illustrate. FIG. 9C represents programming a second unit of data from the host that is in the same sequential data stream as the first unit of data from FIG. 8A. Referring back to FIG. 8A, the residual data was in the group (e.g., page) of LDL latches 151 on memory die 108b. The data from LDL latches 151 is programmed as LP6 in memory cells in group 83f in FIG. 9C. The data from MDL latches 152 on memory die 108b is programmed as MP6 in memory cells in group 83f The data from UDL latches 153 on memory die 108b is programmed as UP6 in memory cells in group 83f. Step 914 may program LP6, MP6, and UP6, in the example of FIG. 9C. Step 914 is one embodiment of step 904 of process 900.

In one embodiment, group 83*f* is physically adjacent to group 83*b*. For example, groups 83*b* and 83*f* may be associated with adjacent word lines in the same block. In this manner the memory system may store the second unit of data physically adjacent to the first unit of data of the same sequential data stream.

After step 914 other groups of lower, middle, and upper pages may be programmed. The process of FIG. 8B may be used. This may result in programming LP7, MP7, and UP7 into group 83*g*; programming LP8, MP8, and UP8 into group 83*h*; programming LP9, MP9, and UP9 into group 83*i*; and programming LP10, MP10, and UP10 into group 83*j*. Programming these other pages of memory cells represents one example of step 906 from process 900.

For the sake of illustration, this may leave two residual pages of data. One residual page may be stored in the LDL latches 151 on memory die 2*c*. The other residual page may be stored in the MDL latches 152 on memory die 2*c*. This concept of storing residual pages has already been discussed with respect to steps 710 and 712 of process 700. Thus, this is another example of those steps.

Figure 10B:
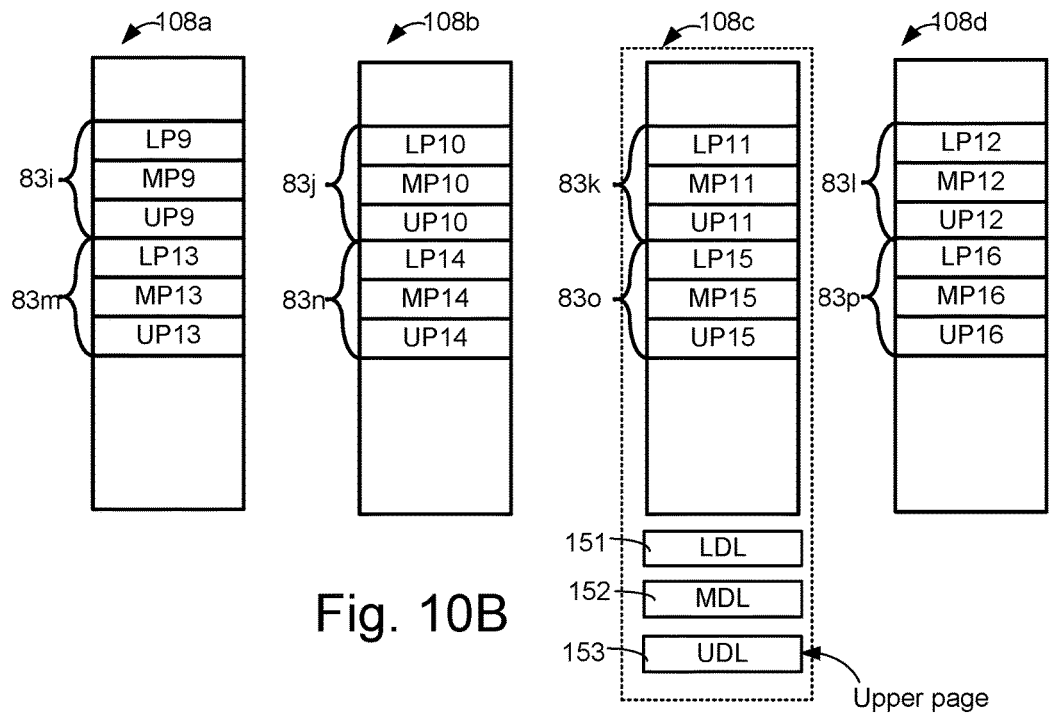
FIG. 10B is a diagram to illustrate how pages may be programmed in one embodiment.
Figure 10A:
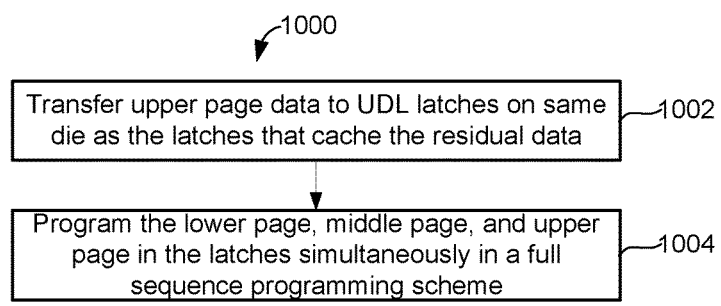
FIG. 10A is a flowchart of one embodiment of process for when there are two residual pages of data.

FIGS. 10A and 10B will now be discussed to continue with the example of combining cached residual data with new sequential data. For example, the memory system receives a new unit of data from the host and determines that it is part of the same sequential data stream as the units in the examples of FIGS. 8A and 9C. Referring to process 700 of FIG. 7, in step 702, the third unit of data is received from the host. In step 706, the memory system determines that the third unit of data is part of the same sequential data stream as the units in the examples of FIGS. 8A and 9C. Thus, process 900 of FIG. 9A may be performed. FIG. 10A is a flowchart of one embodiment of process 1000 for when there are two residual pages of data. In step 1002, a new upper page of data is transferred to a page of the UDL latches 153 on the same memory die that cache the residual data. Referring to FIG. 10B, the page of LDL 151 and the page of MDL 152 latches on memory die 2*c* are presently caching the two pages of residual data. Thus, the page of UDL latches 153 on memory die 2*c* receives the new upper page of data. Note that step 1002 is one embodiment of combining residual data with new sequential data, as described in step 902 of process 900.

In step 1004, the lower page, middle page, and upper page in the latches are programming together in a full sequence programming scheme. After step 1004, LP11, MP11, and UP11 are programmed in group 83*k* (see FIG. 10B). Step 1004 is one embodiment of step 904.

Next, other groups of memory cells may be programmed with other pages. Referring to FIG. 10B, group 83*l* receives LP12, MP12, and UP12; group 83*m* receives LP13, MP13, and UP13; group 83*n* receives LP14, MP14, and UP14; group 83*o* receives LP15, MP15, and UP15; and group 83*p* receives LP16, MP16, and UP16. In this example, there is no residual data after programming the third unit of data.

FIG. 11 is one embodiment of a process 1100 of determining whether data is sequential or random, and if sequential, determining whether it is part of a sequential data stream. Process 1100 is one embodiment of steps 704*a* and 706 from process 700 of FIG. 7. In step 1102, the control circuit determines whether the data is sequential or random based on the size of the unit of data. If the unit of data is 512 KB it is characterized as sequential data. If the unit of data is other than 512 KB it is characterized as random data, in step 1104. The random data could be a FAT write, as one example.

In step 1104, the logical address (LA) of the unit of data is compared to a table of recent commands in one embodiment. The memory controller 122 maintains a command table 246 of recent commands in one embodiment. Each time the memory controller 122 receives a new write command from the host, the command table 246 may be updated with the logical address of the data in the command. The length of the data may also be included in the command table 246. Thus, the command table 246 includes the logical address of the units of data recently received from the host. In step 1106, the memory controller compares the LA of the unit of data with the LA of recent commands in the command table 246. The memory controller 122 determines whether the logical address of the new data from the host is contiguous with any of the logical addresses in the command table 246, in step 1109. If so, then the new data is characterized as being part of the same sequential data stream, in step 1110.

If the LA of the new data is not contiguous with any of the logical addresses in the command table it is characterized as a new sequential data stream, in one embodiment of step 1112. Note that in some cases, the LA of the new data might not be contiguous with any of the LAs in the command table 246, but it may be close to one or more. In this case, the new data might be re-characterized as sequential data in response to receiving further data that that fills the gap in the LAs. Also note that the technique for characterizing data as sequential is one example. Other possibilities exist.

Also, note that there may be more than one sequential stream that is being processed at a time. This may be the case if, for example, one sequential stream is being processed on one set of memory die, and another sequential stream is being processed on another set of memory die. For example, the examples in FIGS. 8A, 9C, and 10B were of one sequential stream being processed in connection with memory die 108*a*-108*d*. It is possible for the memory controller to be separately processing another sequential stream on a different set of memory die. Note that in this case, there will be no interference of the cached residual data of one stream with the other stream, since each memory die may contain its own latches.

Figure 12A:
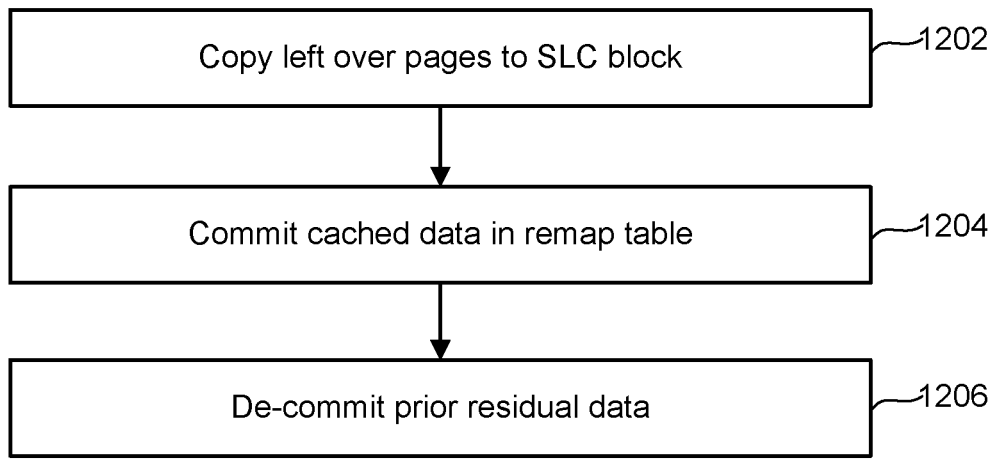
FIG. 12A is a flowchart of one embodiment of a process of saving the residual data as a backup in an SLC block.

In one embodiment, in addition to caching residual data in a group (e.g., page) of volatile latches 194, the residual data is also stored in non-volatile memory cells. This may be used as a safety precaution in the event that the residual data in the volatile latches 194 is lost, for example, due to a loss of power. FIG. 12A is a flowchart of one embodiment of a process 1200 of saving the residual data as a backup in an SLC block. This process 1200 may be performed following step 712 in which the residual page (or pages) is cached in the volatile latches. In step 1202, the residual page(s) is/are copied to an SLC block. An SLC block refers to a block of memory cells in which memory cells each store a single bit of data. In one embodiment, the SLC block is on the same memory die as the volatile latches that cache the residual data. However, SLC block could be on a different memory die. In one embodiment, an "on-chip" copy is performed to transfer the data from the volatile latches to the memory cells in the SLC block. In an on-chip copy, there is no need to transfer any data over a bus between a memory die and a memory controller. Referring back to FIG. 3, each set of latches 194(0)-194(3) may be associated with one bit line. Thus, the data in one LDL latch 151, for example, may be used for any memory cell associated with that bit line. For example, LDL latch 151 in latches 194(0) may be used for any memory cell on BL0, depending on the selected word line. Thus, by selecting a word line in the desired SLC block, the data in the LDL latch 151 can be stored in the SLC block in an "in-chip" copy.

Figure 12D:
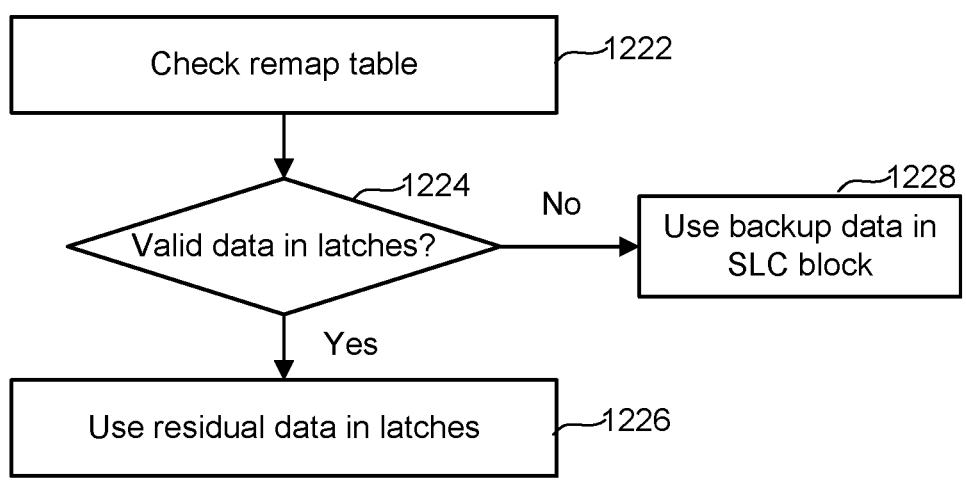
FIG. 12D is a flowchart of one embodiment of a process that can use the backup copy when the residual data from the volatile latches is lost.
Figure 12B:
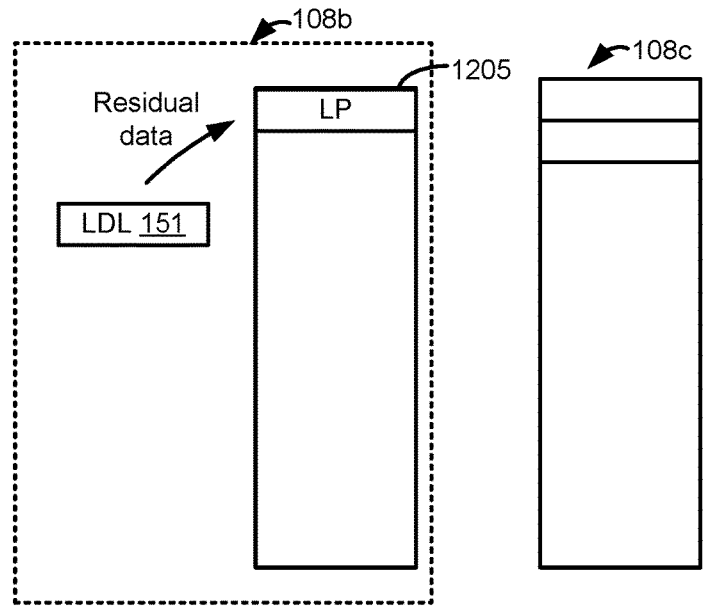
FIGS. 12B and 12C depict details of one embodiment the process or FIG. 12A.

With reference to the example of FIG. 8A, when the residual page is cached in the LDL latches 151 in memory die 108b, an on die copy may be performed, to save a copy in non-volatile memory cells. This is depicted in FIG. 12B, which shows the residual data being copied from LDL 151 (on die 108b) to a group 1205 of memory cells in die 108b as a lower page "LP". The group 1205 may be one page of memory cells.

Figure 12C:
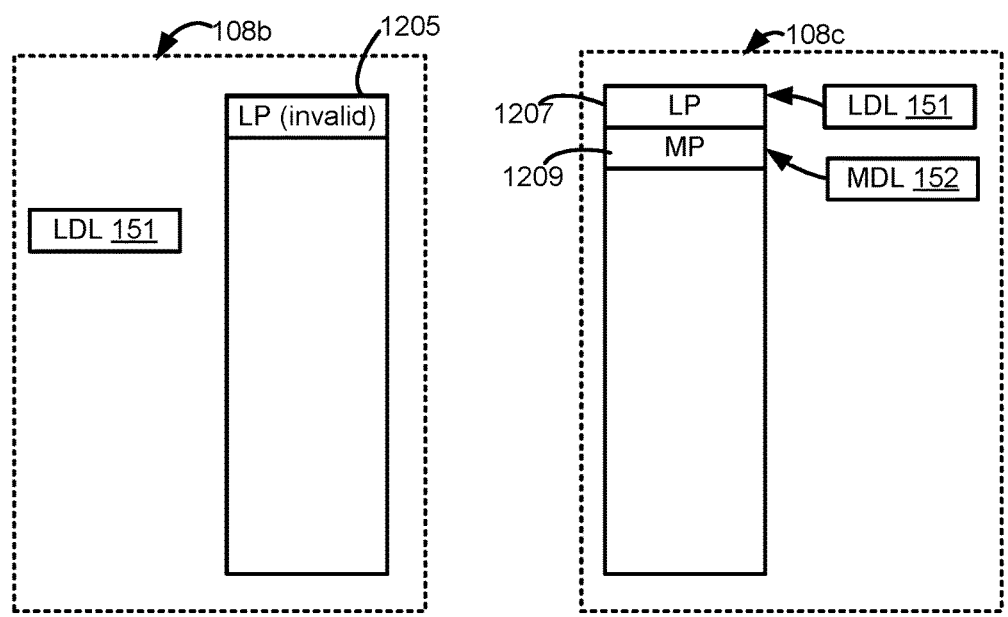

With reference to the example of FIG. 9C, when the residual pages are cached in the LDL latches 151 and MDL latches 152 in memory die 2c, an on die copy may be performed, to save a copy in non-volatile memory cells. This is depicted in FIG. 12C, which shows the residual data being copied from LDL 151 (on die 2c) as LP in group 1207 of memory cells in die 2c, as well as residual data being copied from MDL 152 (on die 2c) as MP in group 1209 of memory cells in die 2c. Each group 1207, 1209 may be one page of memory cells.

In step 1204, the residual data in the volatile latches 194 is committed in a remap table 244 in the memory controller 122. Referring now to the example of FIG. 12B, commit logic 242 may mark the remap table to indicate that the residual data in the LDL latches 151 in memory die 108b is valid data. The remap table may also store an indication that there is valid data in the group 1205 memory cells that store "LP". Referring new to the example of FIG. 12C, commit logic 242 may mark the remap table to indicate that the residual data in the LDL latches 151 on memory die 2c is valid data. The remap table may also store an indication that there is valid data in the group 1207 memory cells that store "LP". Also with respect to the example of FIG. 12C, commit logic 242 may mark the remap table to indicate that the residual data in the MDL latches 152 in memory die 2c is valid data. The remap table may also store an indication that there is valid data in the group 1209 memory cells that store "MP".

Step 1206 includes de-committing previous residual data. For example, referring to FIG. 12C, the data in LDL latches 151 on die 108b is de-committed. Also, the LP data in group 1205 in memory die 108b is marked as invalid. Recall FIG. 12C describes the case when the latches on memory die 2c now contain the cached residual data.

In one embodiment, if the residual data from the volatile latches 194 is lost, then the backup copy from non-volatile storage is used instead. FIG. 12D is a flowchart of one embodiment of a process 1220 that can use the backup copy when the residual data from the volatile latches 194 is lost. This process 1220 assumes that process 1200 has been performed to copy one or more residual pages to volatile storage (such as an SLC block). Process 1220 may be performed when the memory controller 122 determines that new data to be written is part of a sequential data stream. For example, process 1220 could be performed after step 706 of FIG. 7 results in a determination that the write is part of an existing sequential data stream.

In step 1222, the memory controller 122 checks the remap table 244 to determine if there is a valid copy of a page of residual data stored on a memory die. If the remap table 244 indicates that there is a valid copy in data latches 194, then that data may be used in step 1226. For example, a full sequence program operation may combine the data from the latches 194 with newly received data from the host (as described with respect to step 902, for example). If the residual data has been lost from the volatile latches 194 (e.g., due to a power loss), then the backup data may be used in step 1228. For example, if the remap table indicates that group 1205 on memory die 108b contains valid data (see FIG. 12B), then this data can be used. This data could be combined with the new data in a similar manner as the latch data was used in step 902. Note that step 1228 is not limited to performing a step such as step 902.

Figure 13A:
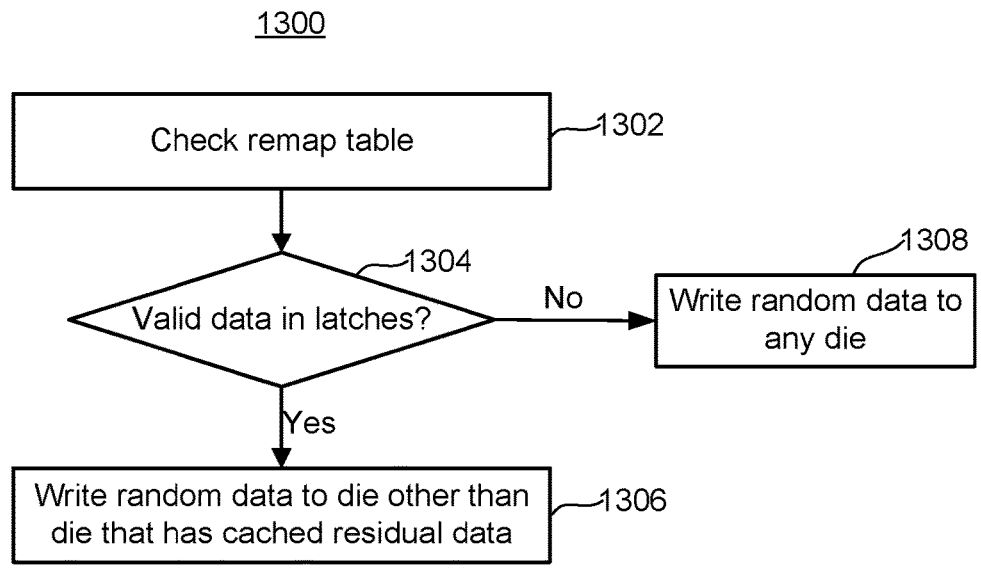
FIG. 13A is a flowchart of one embodiment of a process of dynamic stream management.

In some cases, a random write may be sent by the host in-between sequential write commands that are a part of the same stream. In one embodiment, the memory controller employs dynamic stream management to reduce or eliminate latch 194 dumps. For example, without such dynamic stream management, it is possible that the intervening random writes might cause the cached latch data to be lost, thereby breaking the stream of sequential writes. FIG. 13A is a flowchart of one embodiment of a process 1300 of dynamic stream management. The process 1300 may begin after the memory controller 122 determines that the data is random data in step 704 of FIG. 7.

Figure 13B:
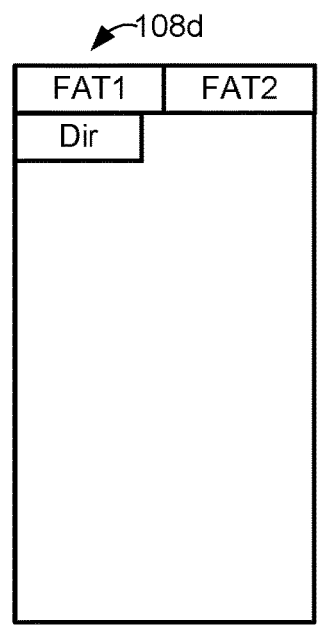
FIG. 13B depicts an example in which information is stored during one embodiment of dynamic stream management.

In step 1302, the memory controller 122 checks the remap table 244 to determine whether there is valid data in latches. For the sake of example, the remap table 244 indicates that the LDL 151, and MDL 152 latches on memory die 108c store valid residual pages. Thus, the random data is written to a die other than the die that contains the cached residual data, in step 1306. FIG. 13B depicts an example in which file allocation tables (FAT1, FAT2) are stored in die 108d, but this could be any die other than 108c. Also, some directory information is also stored in die 108d.

If the random data were to be written to the same die that contains the cached residual data, the data in the latches 194 could be corrupted. For example, were the random data to be stored into the latches 194 on die 108c, it would over-write the residual cached data in the LDL 151, and MDL 152 latches on memory die 108c.

If it was determined in step 1304 that there is not valid data in any latches, then the random data can be written to any die, in step 1308.

After step 1306, the memory controller 122 may receive additional sequential data. If so, the cached residual data may be used in a manner previously described. For example, referring to process 700 of FIG. 7, step 704 may characterize the new data as sequential, and step 706 may determine that the sequential data is part of an existing sequential data stream. Hence, a process such as process 900 of FIG. 9 could be performed. In step 902, a first portion of the new data is combined with the cached residual data. For example, upper page data may be stored into the UDL latches 153 on die 108c. In step 904, the combined data is written using a full sequence programming sequence. For example, the data from the LDL 151, MDL 152, and UDL 153 latched on die 108c are programming into a group of memory cells on die 108c using a full sequence programming sequence. Therefore, the sequential data stream is not broken by the intervening random write.

One embodiment disclosed herein includes a non-volatile storage apparatus comprising: at least one memory die comprising non-volatile memory cells and latches configured to temporarily hold data to be programmed into the non-volatile memory cells; an interface configured to receive data from a host; and a control circuit in communication with the interface, the non-volatile memory cells and the latches. The control circuit is configured to receive a unit of data over the interface to write to the non-volatile memory cells. The control circuit is configured to characterize the unit of data as either sequential data or random data. The control circuit is configured to write a portion of the unit of data as multiple bits per non-volatile memory cell using a full sequence programming scheme that programs all "n" pages to be stored in a page of the non-volatile memory cells in one programming phase, in response to characterizing the first unit of data as sequential data. The control circuit is configured to cache, in a group of the latches, a residual portion of the unit of data for which there is insufficient data to program as "n" pages per non-volatile memory cell in a page of the non-volatile memory cells.

One embodiment disclosed herein includes a method of operating non-volatile storage device comprising the following. A unit of data is received from a host to write to non-volatile memory cells in the non-volatile storage device. A portion of the unit of data is programmed using a full sequence programming scheme that programs all "n" physical pages as "n" bits into a group of the non-volatile memory cells in one programming phase, in response to characterizing the unit of data as sequential data, wherein "n" is greater than one. A determination is made that there is at least one physical page remaining after the write for which there is not sufficient first data remaining to program as "n" physical pages. The at least one physical page is cached in a group of volatile latches on a memory die in the non-volatile storage device.

One embodiment disclosed herein includes a non-volatile storage device, comprising: a plurality of memory die, each memory die comprising a three-dimensional array of non-volatile memory cells and volatile latches configured to temporarily hold data to be programmed into the non-volatile memory cells of the memory die; an interface configured to receive commands from a host; and a control circuit in communication with the interface, the non-volatile memory cells and the volatile latches. The control circuit receives a first command over the interface to program first data into non-volatile memory cells in the non-volatile storage device. The first data is associated with a first logical address. The control circuit determines whether the first data is sequential data or random data. In response to determining that the first data is sequential data, the control circuit: divides the first data into physical pages; programs sets of "n" physical pages into respective groups of the non-volatile memory cells as "n" bits per non-volatile memory cell, wherein "n" is greater than one, comprising writing all "n" physical pages that are to be programmed into each respective group in one programming phase; determines that, after programing the sets of "n" physical pages, there is first data remaining for which there is not sufficient first data remaining to have "n" physical pages, the remaining first data being at least one residual physical page; and caches, in at least one page of the volatile latches on one of the memory die, the at least one residual physical page.

One embodiment includes a non-volatile storage system comprising a plurality of memory die comprising non-volatile memory cells and volatile latches configured to temporarily store data to be programmed into the non-volatile memory cells. The non-volatile storage system comprises interface means for receiving a first command from a host to write a first unit of data to non-volatile memory cells and a second command to write a second unit of data to the non-volatile storage device. The first command comprises a first logical address. The second command comprise a second logical address. The non-volatile storage system comprises data stream characterizing means for characterizing the first unit of data and the second unit of data as being part of the same sequential data stream based on the first and the second logical addresses. The non-volatile storage system comprises programming means for writing a portion of the first unit of data as multiple bits per non-volatile memory cell using a full sequence programming scheme that programs all "n" physical pages to be stored in a page of the non-volatile memory cells in one programming phase, wherein "n" is greater than one. The non-volatile storage system comprises caching means for caching, in a set of the volatile latches on a first die of the memory die, a residual portion of the first unit of data for which there is not sufficient first data to write as "n" physical pages using the full sequence programming scheme, in response to characterizing the first unit of data as sequential data. The programming means is further for writing a combined first portion of the second unit of data and the cached residual portion as multiple bits per memory cell on the first memory die using the full sequence programming scheme, in response to characterizing the first unit of data and the second unit of data as being in the same stream of sequential data.

The interface means of one embodiment may include host interface 220 and a physical layer interface (PHY) 222 that provide the electrical interface with the host or next level storage Controller. The interface means of one embodiment may include data bus 120.

The data stream characterizing means of one embodiment may include controller 122, processor 122c, and/or other hardware and/or software.

The programming means of one embodiment may include controller 122, processor 122c, logic 110, state machine 112, on-chip address decoder 114, power control 116, row decoders 124, column decoders 132, sense blocks (SB1 . . . ) read/write circuits 128, latches 194, and/or other hardware and/or software.

The caching means of one embodiment may include controller 122, processor 122c, logic 110, state machine 112, on-chip address decoder 114, power control 116, row decoders 124, column decoders 132, sense blocks (SB1 . . . ) read/write circuits 128, latches 194, and/or other hardware and/or software.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. A non-volatile storage apparatus comprising:
    at least one memory die comprising non-volatile memory cells and latches configured to temporarily hold data to be programmed into the non-volatile memory cells;
    an interface configured to receive data from a host;
    a control circuit in communication with the interface, the non-volatile memory cells and the latches, the control circuit configured to receive a unit of data over the interface to write to the non-volatile memory cells;
    the control circuit configured to characterize the unit of data as either sequential data or random data;

the control circuit configured to write a portion of the unit of data as multiple bits per non-volatile memory cell using a full sequence programming scheme that programs all "n" pages to be stored in a page of the non-volatile memory cells in one programming phase, in response to characterizing the unit of data as sequential data; and the control circuit configured to cache, in a group of the latches, a residual portion of the unit of data for which there is insufficient data to program as "n" pages per non-volatile memory cell in a page of the non-volatile memory cells.

2. The non-volatile storage apparatus of claim 1, wherein the unit of data is a first unit of data, wherein the control circuit is further configured to:

receive a second unit of data over the interface to write to the non-volatile memory cells;

combine a first portion of the second unit of data with the cached residual portion of the first unit of data in response to characterizing the first unit of data and the second unit of data as being in the same stream of sequential data;

write the combined first portion of the second unit of data and the cached residual portion as multiple bits per memory cell using the full sequence programming scheme.

3. The non-volatile storage apparatus of claim 1, wherein the unit of data is a first unit of data, wherein the group of latches is a first group on a memory die, the latches comprise a second group of latches on the same memory die, wherein the residual portion is cached in the first group, wherein the control circuit is further configured to:

receive a second unit of data over the interface to write to the non-volatile memory cells;

in response to characterizing the first unit of data and the second unit of data as being in the same stream of sequential data, transfer a page of the second unit of data to the second group of latches, and use the full sequence programming scheme to program the residual portion from the first group of latches and the page from the second group of latches as multiple bits per memory cell.

4. The non-volatile storage apparatus of claim 1, wherein the unit of data is a first unit of data, wherein the control circuit is further configured to:

receive a second unit of data over the interface to write to the non-volatile memory cells at a time when the residual portion of the first unit of data is cached in the group of the latches;

characterize the second unit of data as either sequential data or random data;

in response to characterizing the second unit of data as random data, store the second unit of data in non-volatile memory cells on a different memory die than the memory die containing the group of the latches in which the residual portion of the first unit of data is cached, wherein the first unit of data is preserved in the group of the latches.

5. The non-volatile storage apparatus of claim 4, wherein the control circuit is further configured to:

receive a third unit of data over the interface from the host to write to the non-volatile memory cells at a time when the residual portion of the first unit of data is cached in the group of the latches;

in response to characterizing the third unit of data as part of the same stream of sequential data as the first unit of data, combine a first portion of the third unit of data with the cached residual portion of the first unit of data, and write the combined first portion of the third unit of data and the cached residual portion of the first unit of data as multiple bits per non-volatile memory using the full sequence programming scheme.

6. The non-volatile storage apparatus of claim 1, wherein the control circuit is further configured to:

store the residual portion of the unit of data in a group of the non-volatile memory cells at a single bit per non-volatile memory cell;

in response to the cached residual portion of the unit of data being lost from the group of latches, access the residual portion of the unit of data that is stored in the group of non-volatile memory cells, and program the residual portion of the unit of data with other data that is a part of the same sequential data stream as the unit of data at multiple bits per non-volatile memory cell using the full sequence programming scheme.

7. The non-volatile storage apparatus of claim 1, wherein the non-volatile memory cells of a memory die are configured as a three-dimensional array.

8. A method of operating non-volatile storage device, the method comprising:

receiving a unit of data from a host to write to non-volatile memory cells in the non-volatile storage device;

writing a portion of the unit of data using a full sequence programming scheme that programs all "n" physical pages as "n" bits into a group of the non-volatile memory cells in one programming phase, in response to characterizing the unit of data as sequential data, wherein "n" is greater than one;

determining that there is at least one physical page remaining after the write for which there is not sufficient data remaining to program as "n" physical pages; and caching the at least one physical page in a group of volatile latches on a memory die in the non-volatile storage device.

9. The method of claim 8, wherein the unit of data is a first unit of data associated with a first logical address, and further comprising:

receiving a second unit of data from the host to write to the non-volatile memory cells, the second unit of data associated with a second logical address;

characterizing the second unit of data as being part of the same sequential data stream as the first unit of data based on the first and the second logical addresses;

combining a first portion of the second unit of data with the cached at least one physical page in response to characterizing the second unit of data as being part of the same sequential data stream as the first unit of data;

writing the combined first portion of the second unit of data and the cached at least one physical page as multiple bits memory per non-volatile memory cell on the memory die using the full sequence programming scheme.

10. The method of claim 8, wherein the unit of data is a first unit of data associated with a first logical address, wherein the group of volatile latches is a first group of latches, and further comprising:

receiving a second unit of data from the host to write to the non-volatile memory cells, the second unit of data associated with a second logical address;

characterizing the second unit of data as being part of the same sequential data stream as the first unit of data based on the first and the second logical addresses;

in response to characterizing the second unit of data as being part of the same sequential data stream as the first unit of data:
  transferring at least one physical page of the second unit of data to a second group of latches on the same memory die as the first group of latches; and
  using the full sequence programming scheme to program the cached at least one physical page from the first group of latches and the at least one physical page from the second group of latches into a page of the non-volatile memory cells.

11. The method of claim 8, wherein the unit of data is a first unit of data associated with a first logical address, and further comprising:
  receiving a second unit of data from the host to write to the non-volatile memory cells at a time when the at least one physical page of the first unit of data is cached in the group of volatile latches, the second unit of data associated with a second logical address;
  characterizing the second unit of data as random data that is not part of the same stream of sequential data as the first unit of data;
  in response to characterizing the second unit of data as random data, storing the second unit of data in non-volatile memory cells on a different memory die than the memory die that contains the group of volatile latches that hold the at least one physical page, wherein the at least one physical page is preserved in the group of volatile latches.

12. The method of claim 11, further comprising:
  receiving a third unit of data from the host to write to the non-volatile memory cells at a time when the at least one physical page is cached in the group of volatile latches, the third unit of data associated with a third logical address;
  characterizing the third unit of data as part of the same sequential data stream as the first unit of data;
  in response to characterizing the third unit of data as part of the same sequential data stream as the first unit of data, combining a first portion of the third unit of data with the cached at least one physical page, and writing the combined first portion of the third unit of data and the at least one physical page as multiple bits per non-volatile memory cell on the memory die using the full sequence programming scheme.

13. The method of claim 8, further comprising:
  storing the at least one physical page of the unit of data in a group of the non-volatile memory cells at a single bit per memory cell;
  in response to the cached at least one physical page of the unit of data being lost from the group of volatile latches, accessing the at least one physical page of the unit of data that is stored in the group, and programming the at least one physical page of the unit of data with other data at multiple bits per non-volatile memory cell on the non-volatile storage device using the full sequence programming scheme.

14. The method of claim 8, wherein writing a portion of the unit of data using a full sequence programming scheme into the group of the non-volatile memory cells in one programming phase comprises:
  writing the unit of data to non-volatile memory cells in a three-dimensional array.

15. A non-volatile storage device, comprising:
  a plurality of memory die, each memory die comprising a three-dimensional array of non-volatile memory cells and volatile latches configured to temporarily hold data to be programmed into the non-volatile memory cells of the memory die;
  an interface configured to receive commands from a host;
  a control circuit in communication with the interface, the non-volatile memory cells and the volatile latches, the control circuit:
  receives a first command over the interface to program first data into non-volatile memory cells in the non-volatile storage device, the first data being associated with a first logical address;
  determines whether the first data is sequential data or random data;
  in response to determining that the first data is sequential data, the control circuit:
    divides the first data into physical pages;
    programs sets of "n" physical pages into respective groups of the non-volatile memory cells on one or more of the memory die as "n" bits per non-volatile memory cell, wherein "n" is greater than one, comprising writing all "n" physical pages that are to be programmed into each respective group in one programming phase;
    determines that, after programing the sets of "n" physical pages, there is first data remaining for which there is not sufficient first data remaining to have "n" physical pages, the remaining first data being at least one residual physical page; and
    caches, in at least one page of the volatile latches on a first die of the memory die,
  the at least one residual physical page.

16. The non-volatile storage of claim 15, wherein the at least one page of the volatile latches is a first page on the first memory die, wherein the control circuit:
  receives a second command over the interface to program second data into non-volatile memory cells in the non-volatile storage device, the second data being associated with a second logical address;
  determines that the second data is part of the same sequential data stream as the first data, based on the first and the second logical addresses;
  in response to determining that the first data and the second data are part of the same sequential data stream, the control circuit:
  divides the second data into physical pages;
  transfers at least one physical page of the second data to at least one second page of volatile latches on the first memory die, the at least one physical page of the second data and the at least one residual physical page being "n" physical pages; and
  writes the "n" physical pages together as "n" bits per cell into a page of the non-volatile memory cells on the first memory die in one programming phase.

17. The non-volatile storage device of claim 15, wherein the control circuit:
  receives a second command over the interface to program second data into non-volatile memory cells in the non-volatile storage device, the second data having a length;
  determines that the second data is random data based on the length of the second data;
  in response to determining that the second data is random data, the control circuit stores the second data in a group of non-volatile memory cells on a different memory die than the first memory die, wherein the first data is preserved in the page of the volatile latches on the first memory die.

18. The non-volatile storage of claim 15, wherein the control circuit:
- copies the at least one residual physical page of the first data from the at least one page of volatile latches to a first group of the non-volatile memory cells on the first memory die;
- in response to the cached at least one residual physical page being lost from the at least one page of volatile latches, accesses the at least one residual physical page from the first group of non-volatile memory cells, and programs the at least one residual physical page of the first data with other data that is a part of the same sequential data stream as the first data as "n" physical pages in a second group of non-volatile memory cells on the first memory die, comprising writing all "n" physical pages into the second group in one programming phase.

19. A non-volatile storage system comprising:
- a plurality of memory die comprising non-volatile memory cells and volatile latches configured to temporarily store data to be programmed into the non-volatile memory cells;
- interface means for receiving a first command from a host to write a first unit of data to the non-volatile memory cells and a second command to write a second unit of data to the non-volatile memory cells, the first command comprising a first logical address, the second command comprising a second logical address;
- data stream characterizing means for characterizing the first unit of data and the second unit of data as being part of the same sequential data stream based on the first and the second logical addresses;
- programming means for writing a portion of the first unit of data as multiple bits per non-volatile memory cell using a full sequence programming scheme that programs all "n" physical pages to be stored in a page of the non-volatile memory cells in one programming phase, wherein "n" is greater than one;
- caching means for caching, in a set of the volatile latches on a first die of the memory die, a residual portion of the first unit of data for which there is not sufficient first data to write as "n" physical pages using the full sequence programming scheme, in response to characterizing the first unit of data as sequential data;
- wherein the programming means is further for writing a combined first portion of the second unit of data and the cached residual portion as multiple bits per memory cell on the first memory die using the full sequence programming scheme, in response to characterizing the first unit of data and the second unit of data as being in the same stream of sequential data.

20. The non-volatile storage system of claim 19, wherein:
- the interface means is further for receiving a third command to write a third unit of data to the non-volatile storage system at a time when the residual portion of the first unit of data is cached in the set of the volatile latches on the first memory die;
- the data stream characterizing means is further for characterizing the third unit of data as random data; and
- the programming means is further for storing the third unit of data in non-volatile memory cells on a different memory die than the first memory die, wherein the first unit of data is preserved in the set of the volatile latches on the first memory die.

* * * * *